United States Patent
Papandreou et al.

(10) Patent No.: US 11,056,199 B2
(45) Date of Patent: Jul. 6, 2021

(54) UPDATING CORRECTIVE READ VOLTAGE OFFSETS IN NON-VOLATILE RANDOM ACCESS MEMORY

(71) Applicant: International Business Machines Corporation, Armonk, NY (US)

(72) Inventors: Nikolaos Papandreou, Thalwil (CH); Charalampos Pozidis, Thalwil (CH); Nikolas Ioannou, Zurich (CH); Roman Alexander Pletka, Uster (CH); Radu Ioan Stoica, Zurich (CH); Sasa Tomic, Kilchberg (CH); Aaron Daniel Fry, Richmond, TX (US); Timothy Fisher, Cypress, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/669,264

(22) Filed: Oct. 30, 2019

(65) Prior Publication Data
US 2021/0134377 A1    May 6, 2021

(51) Int. Cl.
*G11C 16/34* (2006.01)
*G11C 16/26* (2006.01)
(Continued)

(52) U.S. Cl.
CPC ........ *G11C 16/3422* (2013.01); *G06F 11/076* (2013.01); *G11C 16/08* (2013.01);
(Continued)

(58) Field of Classification Search
CPC ............... G11C 16/3404; G11C 16/26; G11C 2207/2254; G11C 16/3422; G11C 16/08; G11C 2211/5648; G11C 2211/5634
(Continued)

(56) References Cited

U.S. PATENT DOCUMENTS

| | | | |
|---|---|---|---|
| 8,072,805 B2* | 12/2011 | Chou | G11C 16/34 365/185.03 |
| 8,345,487 B2 | 1/2013 | Kim et al. | |

(Continued)

FOREIGN PATENT DOCUMENTS

WO    2019027799 A1    2/2019

OTHER PUBLICATIONS

Papandreou et al., U.S. Appl. No. 16/554,371, filed Aug. 28, 2019.
(Continued)

*Primary Examiner* — Son L Mai
(74) *Attorney, Agent, or Firm* — Zilka-Kotab, P.C.

(57) ABSTRACT

A computer-implemented method, according to one approach, includes: using a first calibration scheme to calibrate the given page in the block by calculating a first number of independent read voltage offset values for the given page. An attempt is made to read the calibrated given page, and in response to determining that an error correction code failure occurred when attempting to read the calibrated given page, a second calibration scheme is used to recalibrate the given page in the block. The second calibration scheme is configured to calculate a second number of independent read voltage offset values for the given page. An attempt to read the recalibrated given page is also made. In response to determining that an error correction code failure did occur when attempting to read the recalibrated given page, one or more instructions to relocate data stored in the given page are sent.

25 Claims, 18 Drawing Sheets

(51) Int. Cl.
*G11C 16/08* (2006.01)
*G06F 11/07* (2006.01)

(52) U.S. Cl.
CPC .......... *G11C 16/26* (2013.01); *G11C 16/3404* (2013.01); *G11C 2207/2254* (2013.01); *G11C 2211/5634* (2013.01); *G11C 2211/5648* (2013.01)

(58) Field of Classification Search
USPC ..................................... 365/185.09, 185.24
See application file for complete search history.

(56) References Cited

U.S. PATENT DOCUMENTS

| | | | |
|---|---|---|---|
| 9,576,671 B2* | 2/2017 | Karakulak | G11C 16/26 |
| 9,852,804 B2* | 12/2017 | Park | G11C 29/028 |
| 9,905,302 B2* | 2/2018 | Karakulak | G11C 16/26 |
| 9,996,281 B2 | 6/2018 | Sharon et al. | |
| 10,236,067 B2 | 3/2019 | Fisher et al. | |
| 10,268,407 B1 | 4/2019 | Madraswala et al. | |
| 10,453,537 B1* | 10/2019 | Reuter | G11C 16/26 |
| 10,699,791 B2* | 6/2020 | Pletka | G06F 11/073 |
| 2011/0016372 A1 | 1/2011 | Nelson et al. | |
| 2014/0281808 A1 | 9/2014 | Lam | |
| 2017/0358369 A1 | 12/2017 | Chinnakkonda Vidyapoornachary et al. | |

OTHER PUBLICATIONS

International Search Report and Written Opinion from PCT Application No. PCT/IB2020/059745, dated Feb. 3, 2021.

\* cited by examiner

750

| metadata | offset | page type |
|---|---|---|
| o1 | a1 | TP |
| o2 | a2 | TP |
| o3 | a3 | TP |
| o4 | a4 | TP |
| o5 | a5 | TP |
| o6 | a6 | XP |
| o7 | a7 | XP |
| o8 | a8 | XP |
| o9 | a9 | UP |
| o10 | a10 | LP |

| metadata | offset | page type |
|---|---|---|
| o1 | c1 | TP |
| o2 | c1 | TP |
| o3 | c1 | TP |
| o4 | c1 | TP |
| o5 | c1 | TP |
| o6 | c2 | XP |
| o7 | c2 | XP |
| o8 | c2 | XP |
| o9 | c3 | UP |
| o10 | c4 | LP |

FIG. 7E

UPDATING CORRECTIVE READ VOLTAGE OFFSETS IN NON-VOLATILE RANDOM ACCESS MEMORY

BACKGROUND

The present invention relates to data storage systems, and more particularly, this invention relates to updating corrective read voltage offset values for blocks of memory in non-volatile random access memory (NVRAM).

NVRAM is a type of random-access memory which retains information stored thereon even after the power supply is turned off, and includes a number of different forms. Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program/erase (P/E) cycling, charge leakage over time (i.e., data retention), and additional charge placed in the cells by read or program operations (i.e., read or program disturb errors, respectively). Typically, a Flash memory block is retired when any page in the block exhibits a code word that reaches a page retirement error count limit. This limit is typically set to be achieved in conjunction with an appropriate error correction code (ECC), resulting in the Uncorrectable Bit Error Rate (UBER) after applying the ECC for a Flash memory block being set to be similar to the UBER in traditional hard disk drives, e.g., at around $10^{-15}$, but may be more or less.

Block calibration, which refers to algorithms that adjust the read voltages, has been shown to significantly improve the RBER and therefore enhance endurance and retention, particularly for enterprise-level Flash memory systems using modern three-dimensional (3-D) triple-level-cell (TLC) or quad-level-cell (QLC) NAND Flash memory. Previous attempts to maintain efficient memory performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects.

Ideally, the read voltages for each page in a block of memory are updated individually. However, as the storage capacity of memory increases, the amount of storage consumed by maintaining a set of read voltage offset values for each page, depending on the number of read voltages associated with reading the given pages, in each block of memory increases as well. For instance, advancing from 3 bits per cell in TLC NAND Flash memory to 4 bits per cell in QLC NAND Flash memory, each block implements 16 threshold voltage levels (instead of 8 in TLC), and 15 different read voltages (instead of 7 in TLC) to read any of the pages included therein. Depending on the page type, e.g., lower, upper, extra, top, a subset of those 15 read voltages is used to read a given page. Moreover, with the improvements in vertical stacking and process technology, the number of layers in every new generation of 3-D NAND Flash increases as well. Subsequently, the number of pages in each block also increases. For example, current 3-D QLC NAND Flash memory may have more than 90 layers and each block may have more than 4000 pages. Thus, if all of these 15 different read voltages in 3-D QLC NAND are calibrated independently (or individually), the amount of metadata involved with storing an individual set of read offset values for each page, or group of pages, in a block and the number of calibration reads per page increases significantly.

As the storage capacity of memory continues to increase, reliability issues associated with the memory increase as well. As a result, conventional calibration engines have experienced an increasing amount of processing overhead caused by the declining reliability of the memory in addition to the increasing number of read voltage offset values that are associated with each page in each block of memory.

SUMMARY

A computer-implemented method, according to one approach, includes, for each page in a block of memory: using a first calibration scheme to calibrate the given page in the block. The first calibration scheme is configured to calculate a first number of independent read voltage offset values and a first number of common read voltage offset values for pages in a block of memory. An attempt is made to read the calibrated given page, and in response to determining that an error correction code failure occurred when attempting to read the calibrated given page, a second calibration scheme is used to recalibrate the given page in the block. The second calibration scheme is configured to calculate a second number of independent read voltage offset values and a second number of common read voltage offset values for pages in a block of memory. Moreover, the first number of independent read voltage offset values is less than the second number of independent read voltage offset values. An attempt to read the recalibrated given page is also made. In response to determining that an error correction code failure did occur when attempting to read the recalibrated given page, one or more instructions to relocate data stored in the given page are sent.

In some approaches, using the first calibration scheme to calibrate the given page in the block includes: determining one or more read voltages associated with a page type that corresponds to the given page, and determining one or more existing read voltage offset values which correspond to the one or more read voltages. A corrective offset is computed for each of the existing read voltage offset values, and the corrective offsets are used to update the existing read voltage offset values. In other approaches, using the second calibration scheme to calibrate the given page in the block includes: determining one or more read voltages associated with a page type that corresponds to the given page, and determining one or more existing read voltage offset values which correspond to the one or more read voltages. A corrective offset is computed for each of the existing read voltage offset values, and the corrective offsets are used to update the existing read voltage offset values.

It follows that different types of calibration schemes may be more desirable for different situations, where the specific calibration scheme indicates how the page will actually be calibrated. For instance, a calibration scheme which involves calculating a common read voltage offset value for each subset of read voltages associated with the respective page types in a word-line involves less computing overhead and computation delay than a calibration algorithm which involves calculating a common read voltage offset value for only part of the read voltages in the word-line as well as an independent voltage offset values for the remaining read voltages in the word-line. Despite the additional computing overhead and computation delay associated with the calibration algorithm which involves calculating a common read voltage offset value for only part of the read voltages in the word-line as well as an independent voltage offset value for the remaining read voltages in the word-line, increased read performance is also achieved as a result of the additional accuracy.

As a result, various approaches included herein are able to improve operation of memory and/or memory controllers by significantly reducing calibration overhead while also ensuring efficient performance of memory. These improvements may be achieved at least in part as a result of implementing the first calibration scheme during nominal operation, and implementing the second calibration scheme on-demand in error recovery mode situations. While the second calibration scheme is able to achieve more accurate calibration results compared to the first calibration scheme, the first calibration scheme produces less calibration overhead relative to that experienced as a result of implementing the second calibration scheme. Thus, by selectively implementing the second calibration scheme, performance is improved while also ensuring favorable memory management.

A computer program product, according to another approach, includes a computer readable storage medium having program instructions embodied therewith. The program instructions are readable and/or executable by a processor to cause the processor to, for each page in a block of memory: perform the foregoing method.

A system, according to yet another approach, includes: a plurality of NVRAM blocks configured to store data, a processor, and logic integrated with and/or executable by the processor. The logic is configured to, for each page in one of the blocks: perform the foregoing method.

Other aspects and approaches of the present invention will become apparent from the following detailed description, which, when taken in conjunction with the drawings, illustrate by way of example the principles of the invention.

BRIEF DESCRIPTION OF THE DRAWINGS

FIG. 7D is a table illustrating how metadata is mapped to a respective corrective offset, in accordance with one approach.

FIG. 7E is a table illustrating how metadata is mapped to a respective corrective offset, in accordance with one approach.

DETAILED DESCRIPTION

Figure 1:
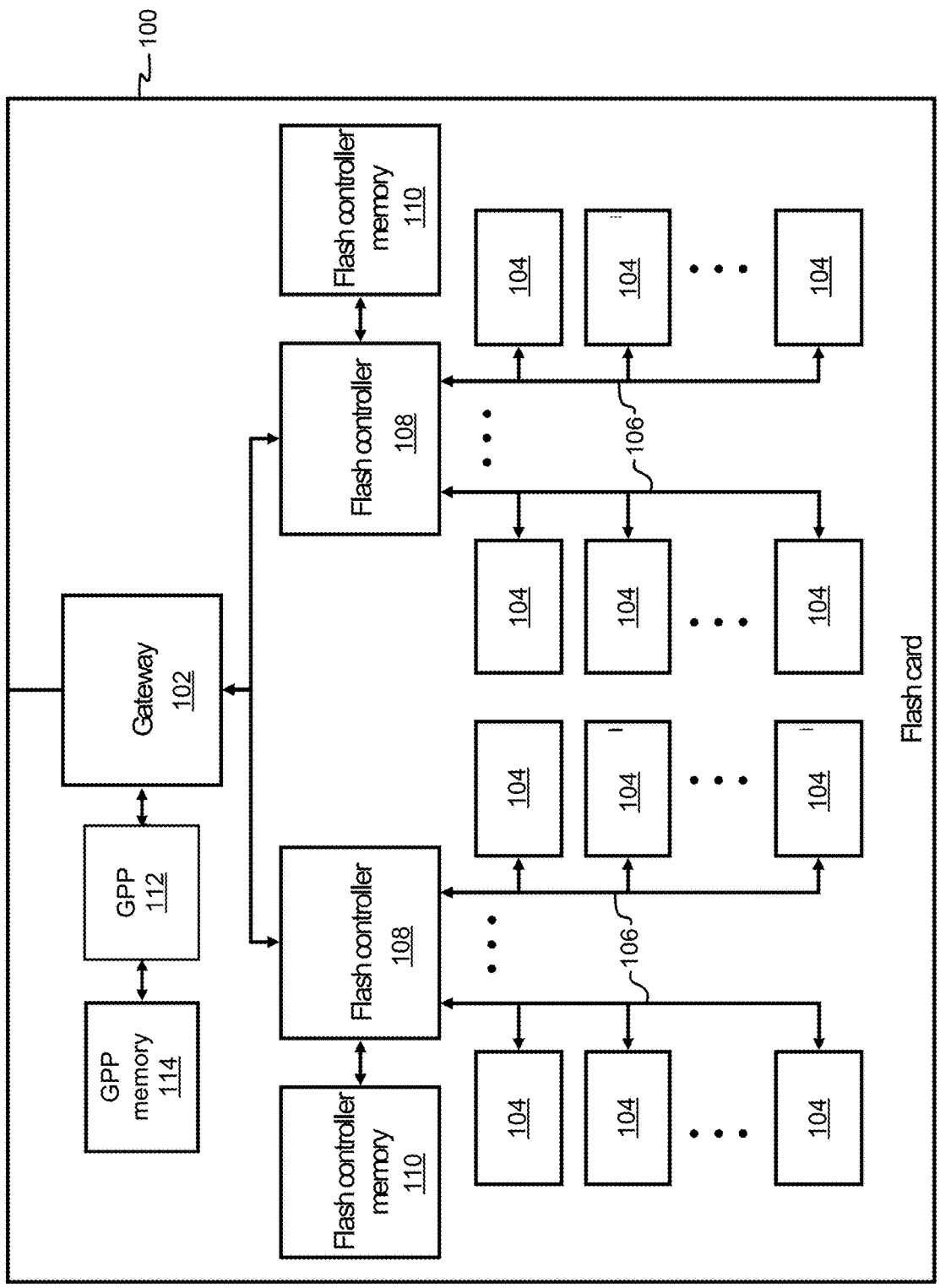
FIG. 1 is a diagram of a non-volatile memory card, in accordance with one approach.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several approaches of data storage systems, as well as operation and/or component parts thereof. It should be appreciated that various approaches herein can be implemented with a wide range of memory mediums, including for example NVRAM technologies such as NAND Flash memory, NOR Flash memory, phase-change memory (PCM), magnetoresistive RAM (MRAM) and resistive RAM (RRAM). To provide a context, and solely to assist the reader, various approaches may be described with reference to a type of non-volatile memory. This has been done by way of example only, and should not be deemed limiting on the invention defined in the claims.

In one general approach, a computer-implemented method includes, for each page in a block of memory: using a first calibration scheme to calibrate the given page in the block. The first calibration scheme is configured to calculate a first number of independent read voltage offset values and a first number of common read voltage offset values for pages in a block of memory. An attempt is made to read the calibrated given page, and in response to determining that an error correction code failure occurred when attempting to read the calibrated given page, a second calibration scheme is used to recalibrate the given page in the block. The second calibration scheme is configured to calculate a second number of independent read voltage offset values and a second number of common read voltage offset values for pages in a block of memory. Moreover, the first number of independent read voltage offset values is less than the second number of independent read voltage offset values. An attempt to read the recalibrated given page is also made. In response to determining that an error correction code failure did occur when attempting to read the recalibrated given page, one or more instructions to relocate data stored in the given page are sent.

In another general approach, a computer program product includes a computer readable storage medium having program instructions embodied therewith. The program instructions are readable and/or executable by a processor to cause the processor to, for each page in a block of memory: perform the foregoing method.

In yet another general approach, a system includes: a plurality of NVRAM blocks configured to store data, a processor, and logic integrated with and/or executable by the processor. The logic is configured to, for each page in one of the blocks: perform the foregoing method.

FIG. 1 illustrates a memory card 100, in accordance with one approach. It should be noted that although memory card 100 is depicted as an exemplary non-volatile data storage card in the present approach, various other types of non-volatile data storage cards may be used in a data storage system according to alternate approaches. It follows that the architecture and/or components of memory card 100 are in no way intended to limit the invention, but rather have been presented as a non-limiting example.

Moreover, as an option, the present memory card 100 may be implemented in conjunction with features from any other approach listed herein, such as those described with reference to the other FIGS. However, such memory card 100 and others presented herein may be used in various applications and/or in permutations which may or may not be specifically described in the illustrative approaches listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various approaches, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various approaches.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various approaches described herein. However, depending on the desired approach, the controller memory 110 may be battery-backed DRAM, phase-change memory PC-RAM, MRAM, STT-MRAM, etc., or a combination thereof.

Figure 2:
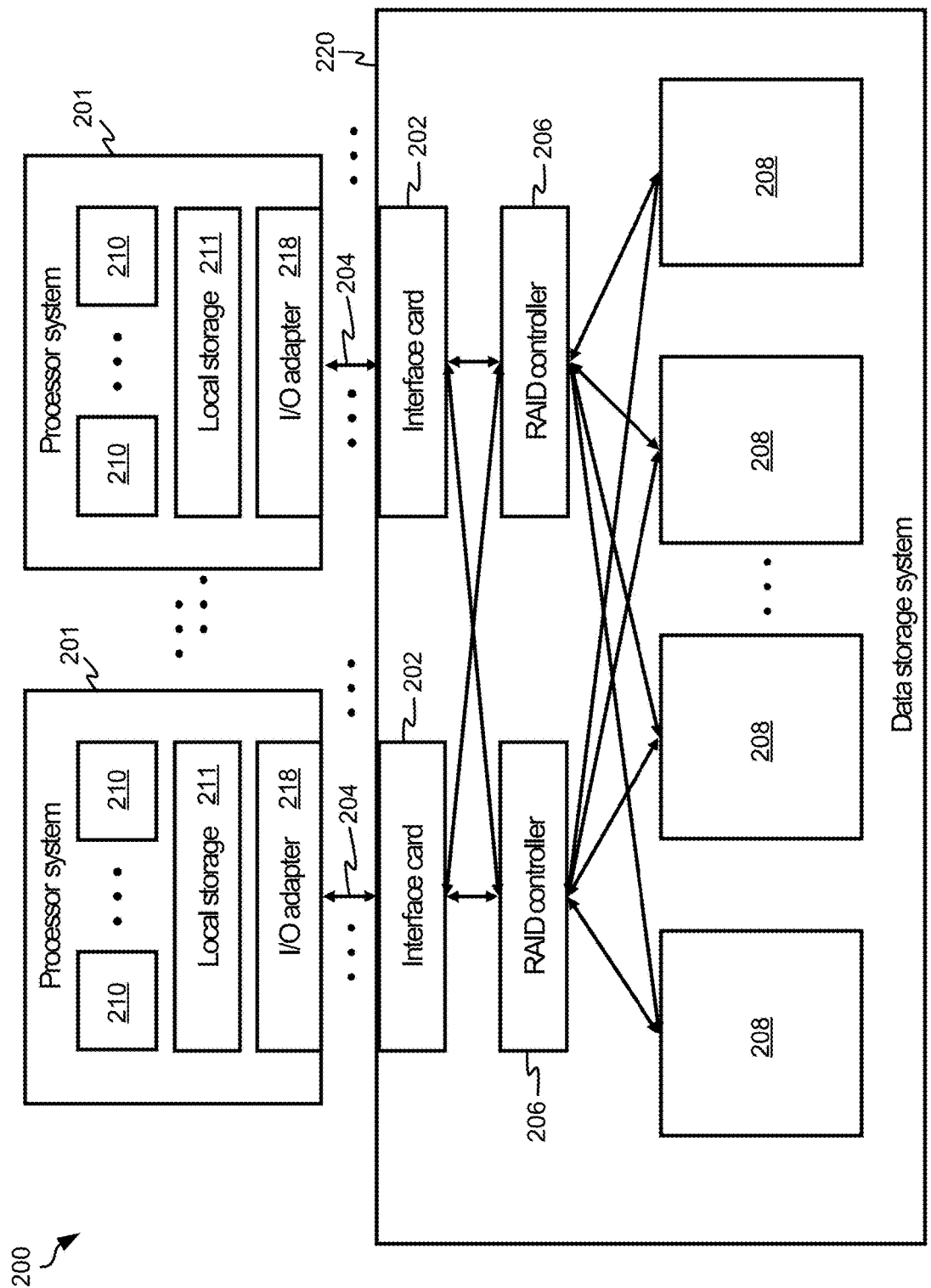
FIG. 2 is a diagram of a data storage system architecture, in accordance with one approach.

As previously mentioned, memory card 100 may be implemented in various types of data storage systems, depending on the desired approach. FIG. 2 illustrates a data storage system architecture 200 according to an exemplary approach which is in no way intended to limit the invention. Moreover, it should be noted that the data storage system 220 of FIG. 2 may include various components found in the approach of FIG. 1.

Looking to FIG. 2, the data storage system 220 comprises a number of interface cards 202 configured to communicate via I/O interconnections 204 to one or more processor systems 201. The data storage system 220 may also comprise one or more Redundant Array of Independent Disks (RAID) controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-6, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1014 of FIG. 10, ROM 1016 of FIG. 10, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired approach. Specifically, memory controllers may include logic configured to perform any one or more of the following functions, which are in no way intended to be an exclusive list. In other words, depending on the desired approach, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logical erase blocks (LEBs) may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or Flash channels are grouped together, such that blocks from the same group can be read or written in parallel, thereby increasing overall bandwidth. It is also possible to combine the previous two methods, and to compose RAID stripes using blocks from different Flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary approach, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the logical to physical table (LPT) mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some approaches. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, write heat segregation may be achieved. In particular, write heat segregating methods may group write hot memory pages together in certain memory blocks while write cold memory pages are grouped together in separate memory blocks. Thus, a write heat segregated LEB tends to be occupied by either write hot or cold data.

The merit of write heat segregation is two-fold. First, performing a garbage collection process on a write hot memory block will prevent triggering the relocation of write cold data as well. In the absence of heat segregation, updates to write hot data, which are performed frequently, also results in the undesirable relocations of all write cold data collocated on the same LEB as the hot data being relocated. Therefore, the write amplification incurred by performing garbage collection is much lower for approaches implementing write heat segregation.

Secondly, the relative write heat of data can be utilized for wear leveling purposes. For example, write hot data may be placed in healthier (e.g., younger) memory blocks, while write cold data may be placed on less healthy (e.g., older) memory blocks relative to those healthier memory blocks. Thus, the rate at which relatively older blocks are exposed to wear is effectively slowed, thereby improving the overall endurance of a given data storage system implementing write heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired approach, logic of a storage system may be configured to perform additional or alternative functions, as would be appreciated by one skilled in the art upon reading the present description.

Figure 3:
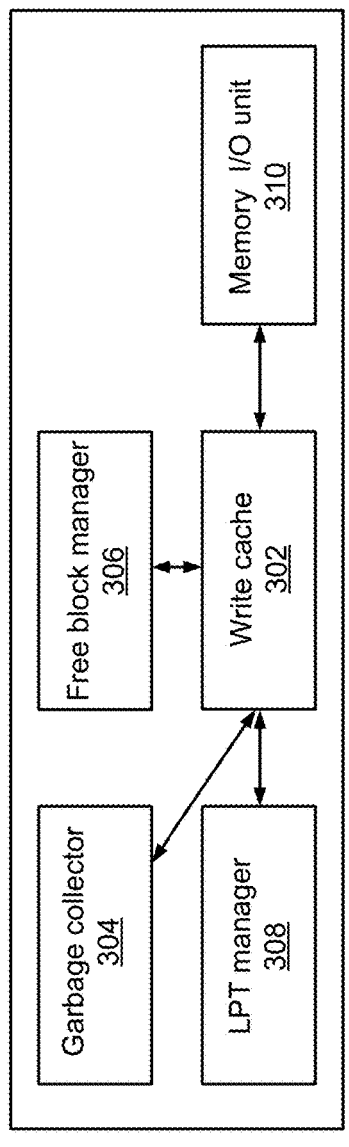
FIG. 3 is a system diagram, in accordance with one approach.

Referring now to FIG. 3, a system 300 is illustrated in accordance with one approach. As an option, the present system 300 may be implemented in conjunction with features from any other approach listed herein, such as those described with reference to the other FIGS. However, such system 300 and others presented herein may be used in various applications and/or in permutations which may or may not be specifically described in the illustrative approaches listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired approach. According to an exemplary approach, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages of memory. According to an example, which is in no way intended to limit the invention, the LPT manager 308 may maintain the logical-to-physical mappings of 4KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4A:
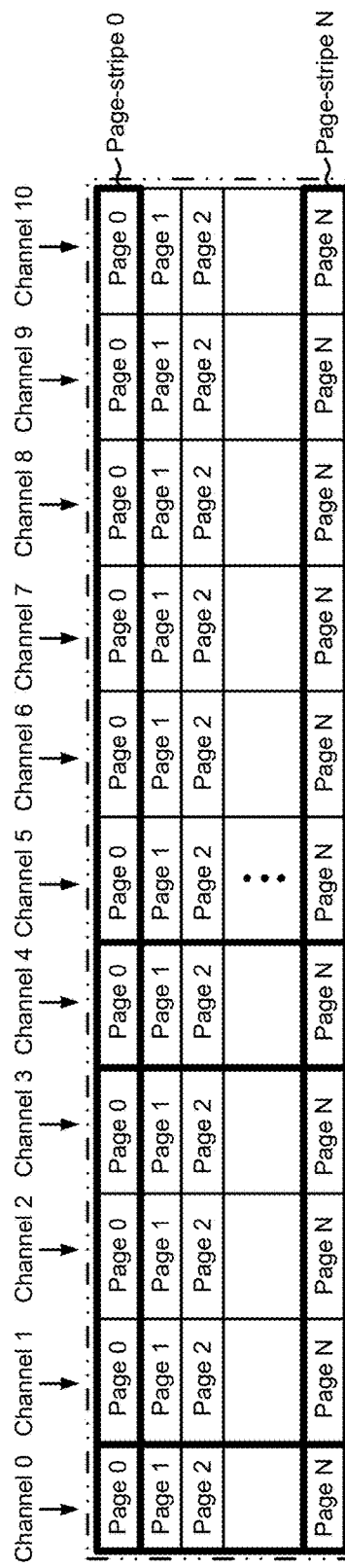
FIG. 4A is a conceptual diagram which includes a block-stripe and page-stripe, in accordance with one approach.

To better understand the distinction between block-stripes and page-stripes as used herein, FIG. 4A is a conceptual diagram 400, in accordance with one approach. LEBs are built from block stripes and typically a single block stripe is used to build a LEB. However, alternative approaches may use multiple block stripes to form an LEB. As an option, the present conceptual diagram 400 may be implemented in conjunction with features from any other approach listed herein, such as those described with reference to the other FIGS. However, such conceptual diagram 400 and others presented herein may be used in various applications and/or in permutations which may or may not be specifically described in the illustrative approaches listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired approach, the conceptual diagram 400 of FIG. 4A may be implemented in defining the organization of data stored in non-volatile memory. Accordingly, both implementations are described in turn below.

Non-Volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given approach of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some approaches one or more blocks of a block-stripe may belong to different physical planes. It follows that each aggregated plane may include one or more block-stripe. Thus, according to an illustrative approach, Block 0 through Block 10 from different physical planes may constitute a block-stripe.

Regardless of whether the conceptual diagram 400 of FIG. 4A is implemented with non-volatile memory and/or a cache architecture, in different approaches, the number of pages in each block and/or the number of channels in each plane may vary depending on the desired approach. According to an exemplary approach, which is in no way intended to limit the invention, a block may include 1024 pages, but could include more or less in various approaches. Analogously, the number of channels per plane and/or the number of planes may vary depending on the desired approach.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4B:
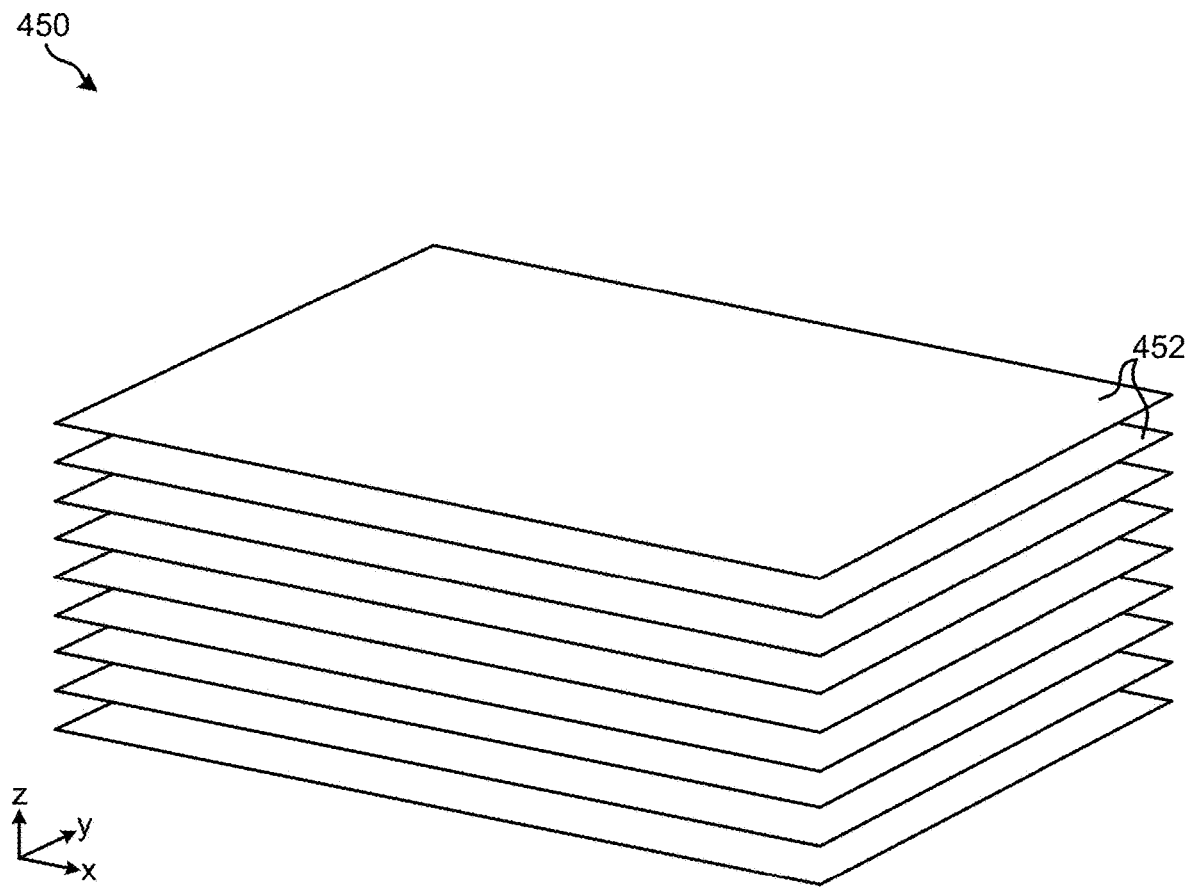
FIG. 4B is a partial perspective view of a 3-D non-volatile memory structure, in accordance with one approach.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one approach. As an option, the present structure 450 may be implemented in conjunction with features from any other approach listed herein, such as those described with reference to the other FIGS., such as FIG. 4A. However, such structure 450 and others presented herein may be used in various applications and/or in permutations which may or may not be specifically described in the illustrative approaches listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency. Cells from different bitlines along a word-line (typically in the x or y dimension of FIG. 4B) are logically combined to form pages. Thus, each block includes more than one word-line therein, and each word-line has more than one read voltage associated therewith. For example, in TLC, each word-line in a block contains 3 physical pages (e.g., a lower page, an upper page, and an extra page) and a word-line typically belongs to one particular layer in the z dimension (perpendicular to the x-y plane).

For a particular block, which is formed from a grid of cells connected by word-lines and bit-lines, the number of word-lines residing on the same layer is typically small. Therefore, a block can be formed from word-lines of all layers 452. Moreover, word-lines as well as pages in the same block may reside on different layers 452. It should also be noted that a block includes more than one type of page therein (e.g., upper page, lower page, extra page, top page), and at least one read voltage is associated with each of the page types, e.g., as would be appreciated by one skilled in the art after reading the present description.

Again, due to cycling, retention, read disturb, program disturb, etc., or other mechanisms that may be specific to the 3-D NAND Flash technology (e.g., floating gate based or charge trap based technology), process technology, cell and material design, circuit and array architecture, etc., or other specific design factors, the programmed threshold voltage distributions in the memory block may change with writing and erasing data (cycling), reading data (read disturb), time (retention), etc., in a relatively slow or fast manner. In other words, the RBER of Flash memory blocks increases with time and use. As memory blocks are used, each P/E cycle performed on the blocks causes damage of the memory cells, which in turn increases the corresponding RBER.

Block calibration is an important aspect of enhancing endurance and retention for Flash storage systems, e.g., particularly enterprise-level Flash systems, by reducing the RBER experienced. This block calibration corresponds to the read voltages and refers to algorithms that are able to track the changes of the threshold voltage distributions and adjust the read voltages accordingly, thereby significantly reducing the bit errors and improving the performance consistency in the respective device by reducing read tail latency which would otherwise result from error recovery mechanism invocations.

Moreover, adjustments to the read voltages are applied during a read command accordingly. It follows that the threshold voltage represents the voltage associated with turning on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
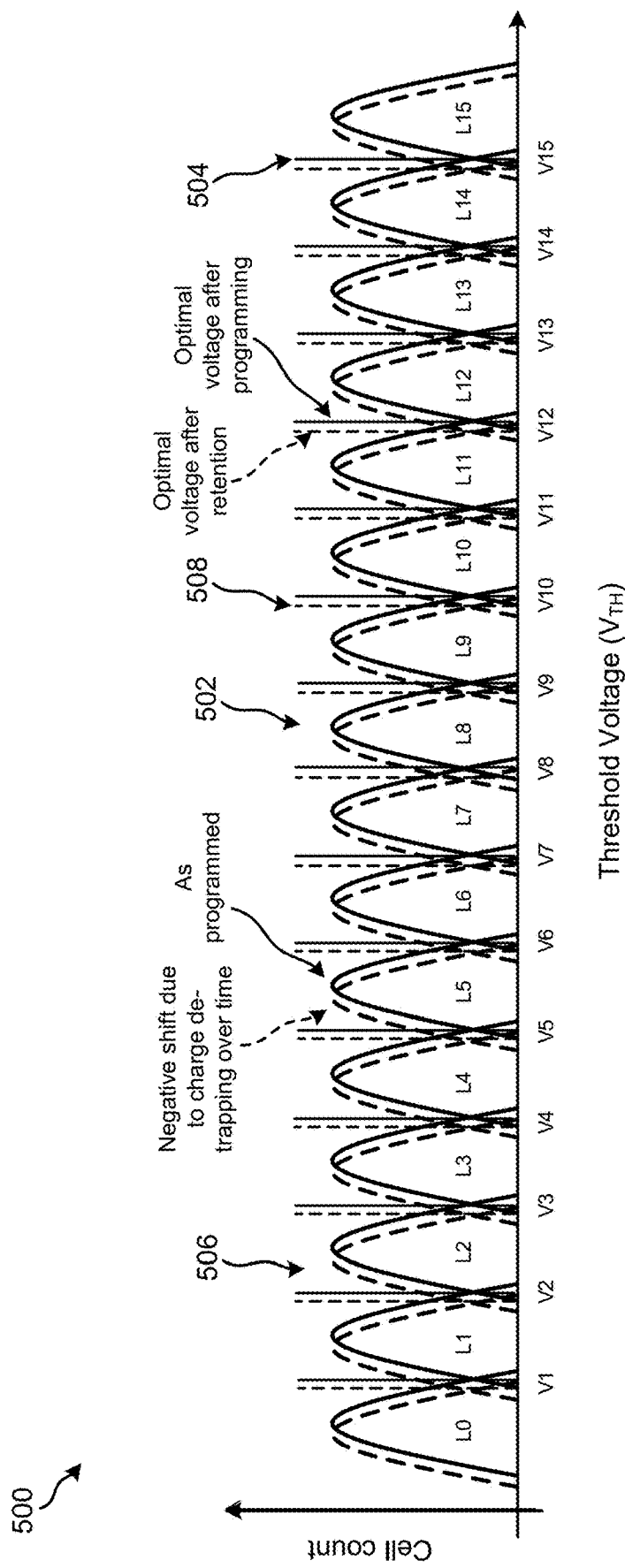
FIG. 5 is a graph which illustrates the threshold voltage shifting phenomenon, in accordance with one approach.

Referring momentarily to FIG. 5, a graph 500 illustrating the threshold voltage shifting phenomenon is illustrated in accordance with an example. The x-axis of the graph 500 represents the programmed threshold voltage VTH, while the y-axis represents the corresponding cell count of a QLC NAND Flash memory block. In QLC NAND Flash memory, each memory cell stores 4 bits of information, therefore, the VTH distributions correspond to 16 possible discrete levels (L0, L1, . . . , L15). Moreover, each different type of page in a given block of QLC NAND Flash has a different set of the read voltages which correspond thereto. According to an example, which is in no way intended to limit the invention, a lower page corresponds to the V8 read voltage, an upper page corresponds to the V4 and V12 read voltages, an extra page corresponds to the V2, V6, V10, and V14 read voltages, while a top page corresponds to the V1, V3, V5, V7, V9, V11, V13 and V15 read voltages.

The solid distributions 502 indicate the VTH levels after programming. The vertical solid lines indicate the read voltages 504 (V1, . . . , V15) that are optimal for the VTH distributions 502. The dashed distributions 506 indicate a negative shift of the VTH levels due to charge loss over time. Because of this negative shift to lower voltages, the read voltages 504 are no longer optimal. Indeed, a negative offset must be applied to the read voltages in order to account for the changes of the VTH distributions from 502 to 506. The vertical dashed lines 508 indicate the read voltages (V1, . . . , V15) that are optimal during retention for the VTH distributions in 506. In general, each of the 16 levels (L0, L1, . . . , L15) shown in the figure may have a different VTH shift and thus, each of the 15 read voltages (V1, . . . , V15) may have a different optimal shift.

Accordingly, the read voltage shift values (or offset values) are preferably determined shortly after a block has been written to and/or periodically thereafter. The threshold voltage can be considered an index of the cell programmed level (i.e., L0, L1, . . . , L15), as determined by measuring the source-drain current when a control gate bias is applied to the memory cell. Typically, upon a read operation, one or more read voltages between adjacent nominal threshold voltage levels are used to determine the memory cell state. As the threshold voltage value of the memory cell changes (as explained above), the read voltages applied during a read operation are preferably shifted accordingly using a set of offset values to obtain optimal readout conditions and minimize the RBER. Subsequently, the optimal read voltage shift values may be updated periodically, e.g., in a background health check, or on demand, e.g., in the event of high bit error count or ECC failure.

Although increases to RBERs are irreparable for some blocks (e.g., such as those caused by prolonged P/E cycles), increases to RBERs caused by events such as retention and/or read disturbances are transient in the sense that the blocks which are affected are not irreversibly damaged. This unfavorable increase in RBERs is remedied when the corresponding memory blocks are recalibrated such that the corresponding read voltages are corrected. In other approaches, blocks experiencing transient RBER increases may be remedied by being erased, programmed, and recalibrated. It is therefore apparent that the RBER of the block depends on the state of the block, which may be determined by the cycling state, the retention state, the read disturb state and/or any combinations thereof. Block recalibration improves the RBER by adjusting the read voltages so that they are optimal under the various changes of the VTH distributions under permanent effects and/or transient effects.

Ideally, the read voltages for each page in a block of memory are updated individually. However, as the storage capacity of memory increases, the amount of storage consumed by maintaining one or more read voltage offset values for each page, where the number of read voltage offset values depends on the page type of the given page, in each block of memory increases as well. For instance, advancing from 3 bits per cell in TLC NAND Flash memory to 4 bits per cell in QLC NAND Flash memory, each block implements 16 threshold voltage levels (instead of 8 in TLC), and 15 different read voltages (instead of 7 in TLC) to read any of the pages included therein. Moreover, with the improvements in vertical stacking and process technology, the number of layers in every new generation of 3-D NAND Flash increases as well. Subsequently, the number of pages in each block also increases. For example, current 3-D QLC NAND Flash memory may have more than 90 layers and each block may have more than 4000 pages. Thus, if all of these 15 different read voltages in 3-D QLC NAND are calibrated independently (or individually), the amount of metadata involved with storing an individual set of read offset values for each page, or group of pages, in a block and the number of calibration reads per page increases significantly.

As the storage capacity of memory continue to increase, reliability issues associated with the memory increase as well. As a result, conventional calibration engines have experienced an increasing amount of processing overhead caused by the declining reliability of the memory in addition to the increasing number of read voltage offset values that are associated with each page in each block of memory.

In sharp contrast to the increasingly inefficient manner in which conventional storage systems have managed memory performance, various ones of the approaches included herein are able to significantly reduce calibration overhead while also improving read performance. These improvements are achieved in some approaches in addition to reducing the impact that metadata corresponding to the calibration process has on storage capacity, e.g., as will be described in further detail below.

Figure 6A:
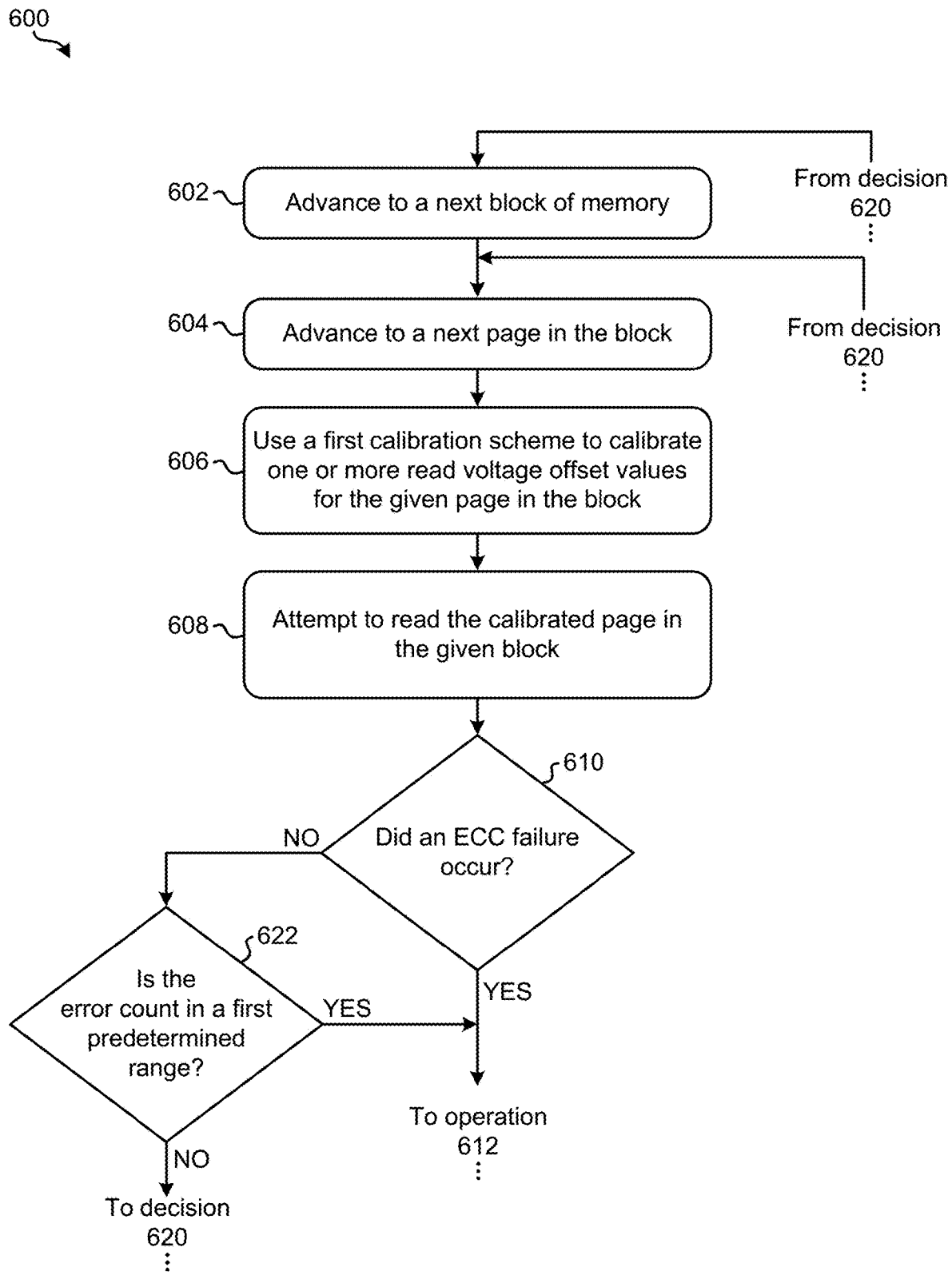
FIG. 6A is a flowchart of a method, in accordance with one approach.
Figure 6A:
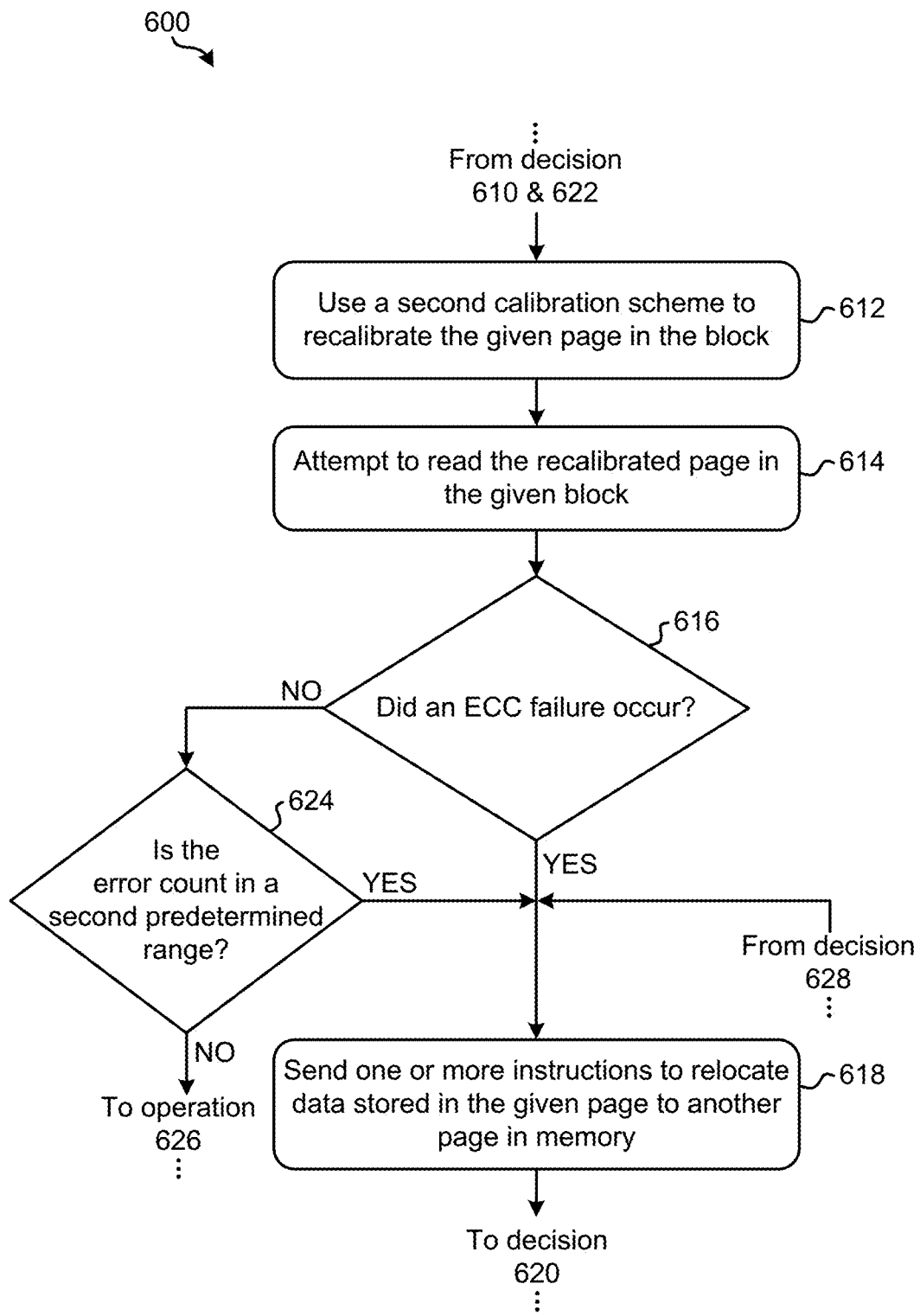
Figure 6A:
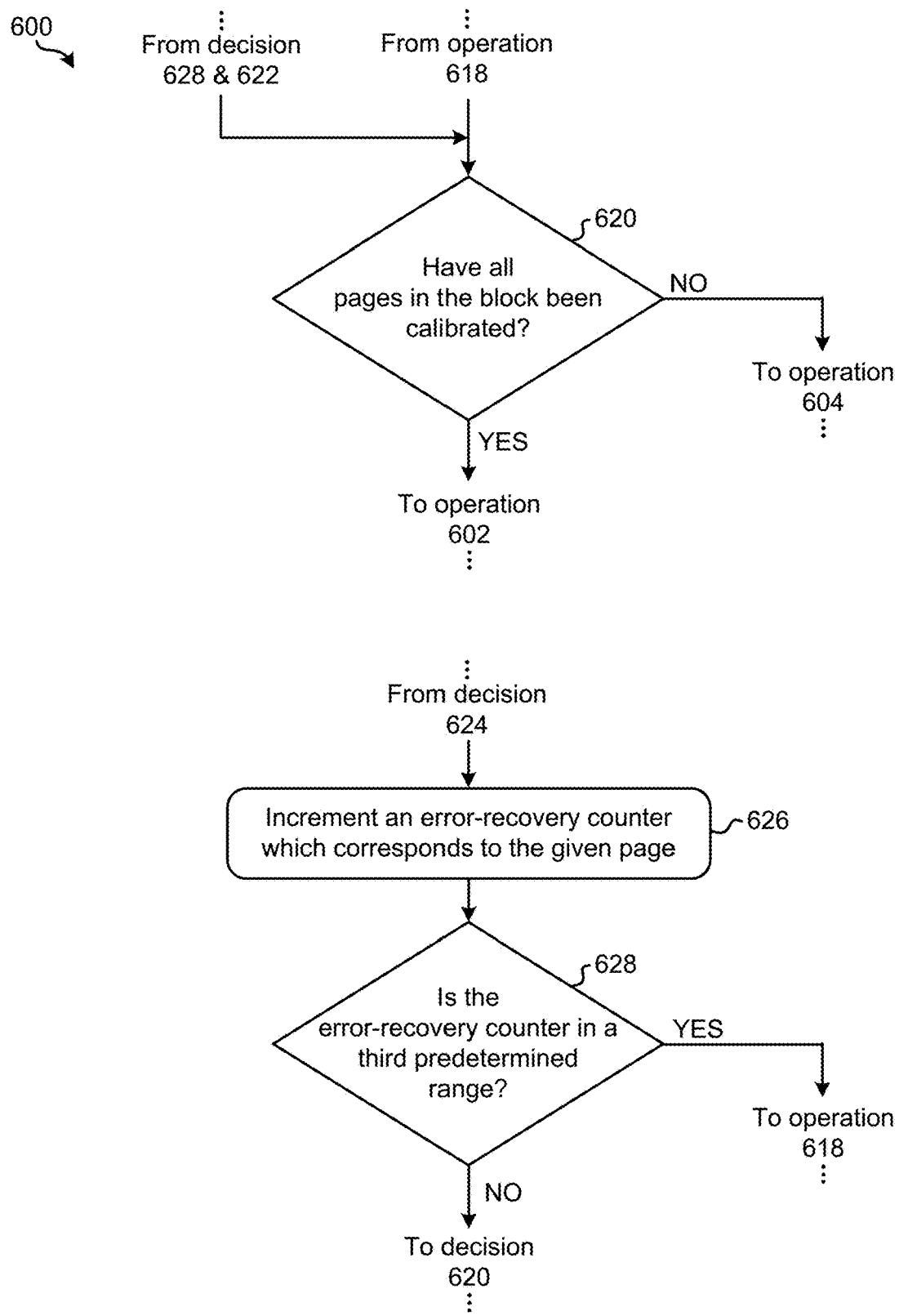

Referring now to FIG. 6A, a flowchart of a method 600 for calibrating read voltages for the pages in a block of memory is illustrated in accordance with one approach. The method 600 may be performed in accordance with the present invention in any of the environments depicted in FIGS. 1-5, among others, in various approaches. For instance, any of the processes included in method 600 may be performed with respect to blocks of storage space in NVRAM, e.g., such as 3-D TLC NAND Flash, 3-D QLC NAND Flash, 3-D penta-level cell (PLC) NAND Flash, etc., or any other desired type of memory. Furthermore, more or less operations than those specifically described in FIG. 6A may be included in method 600, as would be understood by one of skill in the art upon reading the present descriptions.

Each of the steps of the method 600 may be performed by any suitable component of the operating environment. For example, in various approaches, the method 600 may be partially or entirely performed by a controller (e.g., Flash controller, hybrid controller, etc.), a processor, a computer, etc., or some other device having one or more processors therein. Thus, in some approaches, method 600 may be a computer-implemented method. It should also be noted that the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, operation 602 of method 600 includes advancing to a next block of memory. With respect to the present description, "a next block of memory" may vary depending on the given approach. For instance, upon initiating method 600, a next block of memory may simply be a first block of memory. In other approaches, a next block of memory may be a next logical block of memory. Moreover, operation 602 may progress between the blocks of memory in any desired manner, e.g., sequentially, randomly, using a pattern, etc. Moreover, operation 602 may be triggered periodically, e.g., every 1 week, by a background process that examines all the NAND blocks, or may be triggered on demand, e.g., in the event of a page read in a block exhibiting a high bit error count or an ECC failure. Moreover, the memory preferably includes NVRAM. For instance, in some approaches the memory includes 3-D TLC NAND Flash, while in other approaches the memory includes 3-D QLC NAND Flash.

Operation 604 further includes advancing to a next page in the given block. As noted above, "a next page" may vary depending on the given approach. For instance, upon advancing to a new block of memory, a next page may simply be a first page in the block. In other approaches, a next page in the block of memory may be a next page of a particular type (e.g., a next extra page). In still other approaches, a next page may simply be a subsequent page in the given block. It follows that, operation 604 may progress between the pages in a block of memory in any desired manner, e.g., sequentially, randomly, using a pattern, etc.

From operation 604, method 600 proceeds to operation 606, which includes using a first calibration scheme to calibrate one or more read voltage offset values for the given page in the block. As alluded to above, each block includes a number of different page types which depend on the configuration of the block. According to an example, which is in no way intended to limit the invention, a block of 3-D QLC NAND Flash memory includes four different types of pages therein, including a lower page, upper page, extra page, and top page. Each of these types of pages further include one or more read voltages which correspond to reading data that is stored therein. However, the threshold voltage values of the memory cells change over time, thereby making the read voltages ineffective. Read voltage offset values are thereby applied during read operations in order to obtain optimal data readout conditions and minimize the RBER. Subsequently, these read voltage offset values may be updated periodically, e.g., in a background health check.

The pages in a block of memory may be calibrated using any one or more of a number of different types of calibration schemes. Each calibration scheme may differ in terms of how it is applied (e.g., how it is performed), the accuracy by which it recalibrates the block, an amount of time and/or computing resources consumed, etc. Thus, different types of calibration schemes may be more desirable for different situations, where the specific calibration scheme indicates how the page will actually be calibrated.

For instance, a calibration scheme which involves calculating a common read voltage offset (also referred to herein as "shift") value for each subset of read voltages associated with the respective page types in a word-line involves less computing overhead and computation delay than a calibration algorithm which involves calculating a common read voltage offset value for only part of the read voltages in the word-line as well as an independent voltage offset values for the remaining read voltages in the word-line. Despite the additional computing overhead and computation delay associated with the calibration algorithm which involves calculating a common read voltage offset value for only part of the read voltages in the word-line as well as an independent voltage offset value for the remaining read voltages in the word-line, increased read performance is also achieved as a result of the additional accuracy. This improved read performance may be desirable in situations which have experienced a high read error count. It follows that a calibration scheme which causes less computing overhead and/or computational delay may be implemented during "nominal" operation, while a calibration scheme which produces greater amounts of computing overhead and computation delay may be reserved for high error situations, e.g., such as ECC failures as will soon become apparent. It follows that different calibration algorithms may be implemented in different situations, e.g., depending on the desired approach.

With continued reference to operation 606, the first calibration scheme preferably involves one or more processes which are able to calibrate read voltage offset values while producing a relatively low amount of computing overhead and/or computational delay. This may be achieved in some instances by utilizing a calibration scheme which involves calculating a relatively low number of independent voltage offset values and a relatively high number of common read voltage offset values, e.g., at least in comparison to a second calibration scheme as described below.

Operation 608 further includes attempting to read the calibrated page in the given block. In other words, operation 608 includes using the read voltage offset value(s) produced by the first calibration scheme in operation 606 to attempt reading the page. Moreover, decision 610 includes determining whether an ECC failure occurred during the attempt to read the page. An ECC failure corresponds to situations where the number of bit errors experienced while attempting to read a page is higher than the number of errors that can be corrected by the error correction capability of the given error correction code.

Accordingly, in response to determining that an ECC failure did occur during the attempt to read the calibrated page, method 600 advances to operation 612. There, operation 612 includes using a second calibration scheme to recalibrate the given page in the block. As noted above, the first calibration scheme which produces less computing overhead and/or computational delay may be implemented during "nominal" operation, while a more accurate calibration scheme which involves greater amounts of computing overhead and/or computation delay may be reserved for high error situations, e.g., such as ECC failures. It follows that with respect to the present description, the "second calibration scheme" is a calibration scheme which is able to determine the read voltage offset values for page in a block of memory more accurately than the first calibration scheme. This increased accuracy in comparison to the first calibration scheme is a result of calibrating a greater number of independent read voltage offset values than the first calibration scheme.

According to an example, which is in no way intended to limit the invention, the first calibration scheme is capable of calibrating the eight read voltages used when reading a top page by calculating one common offset value that is applied to all eight read voltages, while the second calibration scheme is capable of calibrating those eight read voltages by calculating four independent offset values for the four out of the eight read voltages and a common offset value that is applied to the remaining four read voltages.

With continued reference to FIG. 6A, operation 614 includes attempting to read the recalibrated page in the given block. In other words, operation 614 includes using the read voltage offset value(s) produced by the second calibration scheme in operation 612 to attempt reading the page. Moreover, decision 616 includes determining whether an ECC failure occurred during the attempt to read the recalibrated page. As noted above, an ECC failure corresponds to situations where the number of bit errors experienced while attempting to read a page is higher than the number of errors that can be corrected by the error correction capability of the given error correction code.

Accordingly, in response to determining that an ECC failure did occur during the attempt to read the recalibrated page, method 600 advances to operation 618. There, operation 618 includes sending one or more instructions to relocate data stored in the given page to another page in memory. Relocating the data that is stored in the given page involves data reconstruction be higher order schemes, such as RAID schemes, and allows for the page to be invalidated and decommissioned at least temporarily.

From operation 618, method 600 advances to decision 620 which includes determining whether all of the pages in the given block have been calibrated. In response to determining that at least one of the pages in the given block have not yet been calibrated, method 600 returns to operation 604 such that a next page in the given block may be calibrated. However, in response to determining that all of the pages in the given block have already been calibrated, method 600 returns to operation 602 and advances to a next block in memory. It follows that the various processes included in method 600 may be repeated in an iterative fashion any desired number of times.

Returning now to decision 610, method 600 advances to decision 622 rather than operation 612 in response to determining that an ECC failure did not occur during the attempt to read the calibrated page. In other words, method 600 proceeds to decision 622 in response to determining that operation 608 was able to successfully read data from the calibrated page. As shown, decision 622 includes determining whether an error count corresponding to the given page is in a first predetermined range. Decision 622 thereby determines whether the current page has been performing undesirably recently, e.g., such that counteractive measures may be taken to avoid additional poor performance. The first predetermined range may be predetermined by a user, based on industry standards, using performance capabilities of the memory, be updated dynamically based on past performance, etc. It follows that an error count may be maintained for each page in memory, and updated over time based on performance of the memory. Moreover, the various error counts may be stored in a specified memory location in some approaches, while in other approaches each error count may be maintained by one or more bits which are correlated with the respective page of memory.

In response to determining that the error count corresponding to the given page is in the first predetermined range, method 600 proceeds to operation 612 such that the second calibration scheme may be used to recalibrate the page in the given block which has experienced poor performance over time. However, in response to determining that the error count corresponding to the given page is not in the first predetermined range, a determination may be made that the given page has been accurately calibrated and has been performing desirably. Accordingly, method 600 proceeds directly from decision 622 to decision 620. It should be noted that "in a first predetermined range" or the use of "predetermined range" herein is in no way intended to limit the invention. Rather than determining whether a value is in a predetermined range, equivalent determinations may be made, e.g., as to whether a value is above a threshold, whether a value is outside a predetermined range, whether an absolute value is above a threshold, whether a value is below a threshold, etc., depending on the desired approach.

Returning now to decision 616, method 600 advances to decision 624 rather than operation 618 in response to determining that an ECC failure did not occur during the attempt to read the recalibrated page. In other words, method 600 proceeds to decision 624 in response to determining that operation 614 was able to successfully read data from the calibrated page. As shown, decision 624 includes determining whether the error count corresponding to the given page is in a second predetermined range. Decision 624 thereby determines whether the current page has been performing undesirably, e.g., as described above. The second predetermined range may be the same, similar, or different from the first predetermined range, e.g., depending on the desired approach. In some approaches, the second predetermined range may be narrower than the first predetermined range in an attempt to ensure that the given page is performing desirably after the recalibration operation. Moreover, the second range may be predetermined by a user, based on industry standards, using performance capabilities of the memory, be updated dynamically based on past performance, etc.

In response to determining that the error count corresponding to the given page is in the second predetermined range, method 600 proceeds to operation 618 such that the data stored in the given page may be relocated. However, in response to determining that the error count corresponding to the given page is not in the second predetermined range, a determination may be made that the given page has been accurately recalibrated and has been performing desirably. Accordingly, method 600 proceeds from decision 624 to operation 626 which includes incrementing an error-recovery counter which corresponds to the given page. The error-recovery counter is used to maintain a count which indicates the number of times a page or a block has triggered the performance of the second calibration scheme. The error-recovery counter may thereby be used to effectively manage the relocation of pages or blocks in memory.

Proceeding to decision 628, a determination is made as to whether the error-recovery counter is in a third predetermined range. In response to determining that the error-recovery counter is in the third predetermined range, method 600 advances to operation 618 such that data in the given page may be relocated. However, in response to determining that the error-recovery counter is not in the third predetermined range, method 600 advances directly to decision 620 such that a next page or block may be evaluated.

Figure 6B:
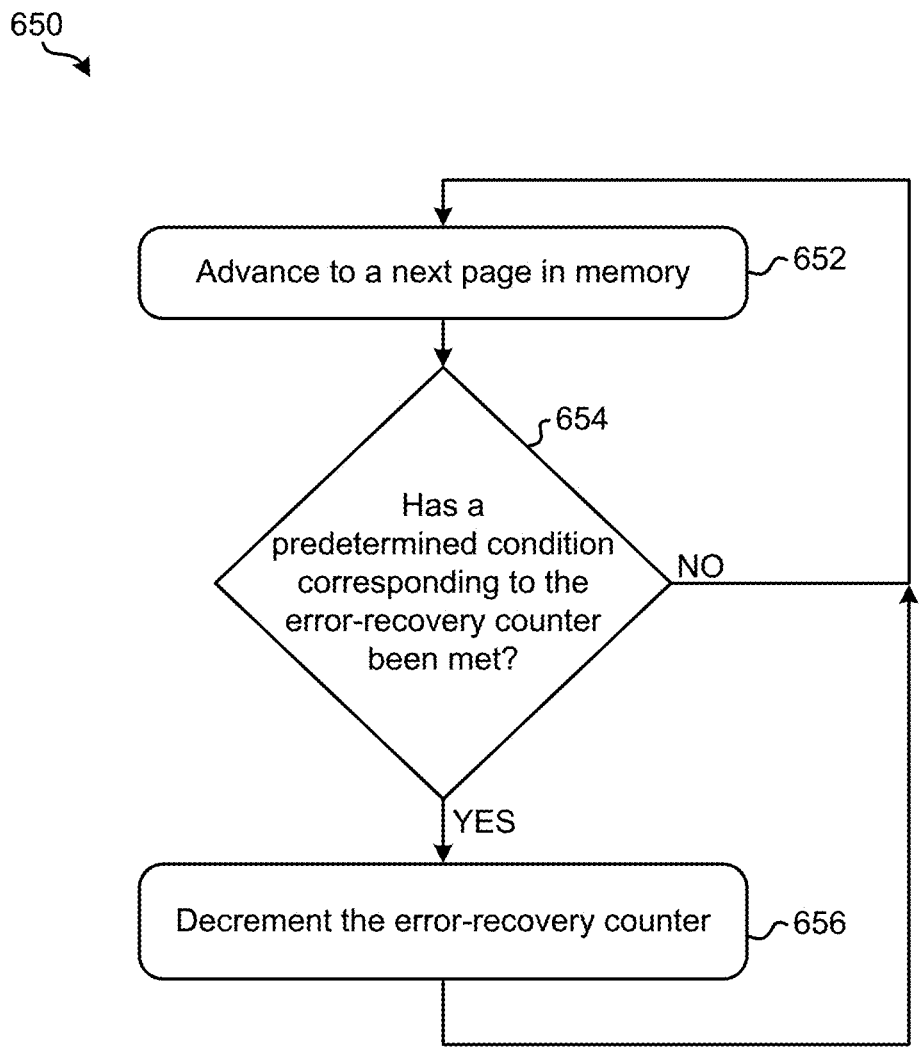
FIG. 6B is a flowchart of a method, in accordance with one approach.

A part of managing the error-recovery counter involves periodically decrementing or even clearing its current value to account for block reinitialization via erase operations. It should also be noted that error recovery may be triggered during host read operations as well in some situations. Referring momentarily to FIG. 6B, exemplary method 650 having processes for managing the error-recovery counter are illustrated in accordance with one approach, any one or more of which may be implemented in the background of method 600 above. However, it should be noted that the processes of FIG. 6B are illustrated in accordance with one approach which is in no way intended to limit the invention.

As shown, method 650 includes advancing to a next page in memory. See operation 652. With respect to the present description, "a next page in memory" may vary depending on the given approach. For instance, upon initiating method 650, a next page in memory may simply be a first page in memory. In other approaches, a next page in memory may correspond to a next page that is evaluated using method 600. It follows that operation 652 may progress between the pages of memory in any desired manner, e.g., sequentially, randomly, using a pattern, etc. It is also preferred that the processes included in method 650 are performed in the background of any other ongoing data management procedures, e.g., as mentioned above.

Referring still to FIG. 6B, decision 654 includes determining whether a predetermined condition corresponding to the error-recovery counter has been met. These conditions may be predetermined by a user, a system administrator, etc. depending on the desired approach, but preferably correspond to the performance of the given page or block. According to an example, which is in no way intended to limit the invention, the predetermined condition may specify a number of P/E cycles that the given page or block should perform before the error-recovery counter may be decremented.

Accordingly, in response to determining that the predetermined condition corresponding to the error-recovery counter has been met, the flowchart proceeds to operation 656 which includes decrementing the error-recovery counter. The amount by which the error-recovery counter is decremented and/or incremented varies depending on the approach. For example, in some approaches the error-recovery counter is incremented and decremented by one each time. From operation 656, method 650 returns to operation 652, e.g., such that the error-recovery counter corresponding to a subsequent page may be evaluated. Moreover, returning to decision 654, method 650 returns directly to operation 652 in response to determining that a predetermined condition corresponding to the error-recovery counter has not been met.

It follows that the various processes in method 600 as well as those included in method 650 are able to improve operation of memory and/or memory controllers by significantly reducing calibration overhead while also ensuring efficient performance of memory. These improvements may be achieved at least in part as a result of implementing the first calibration scheme during nominal operation, and implementing the second calibration scheme on-demand in error recovery mode situations. As mentioned above, while the second calibration scheme is able to achieve more accurate calibration results compared to the first calibration scheme, the first calibration scheme produces less calibration overhead relative to that experienced as a result of implementing the second calibration scheme. Thus, by selectively implementing the second calibration scheme, performance is improved while also ensuring favorable memory management.

Figure 6C:
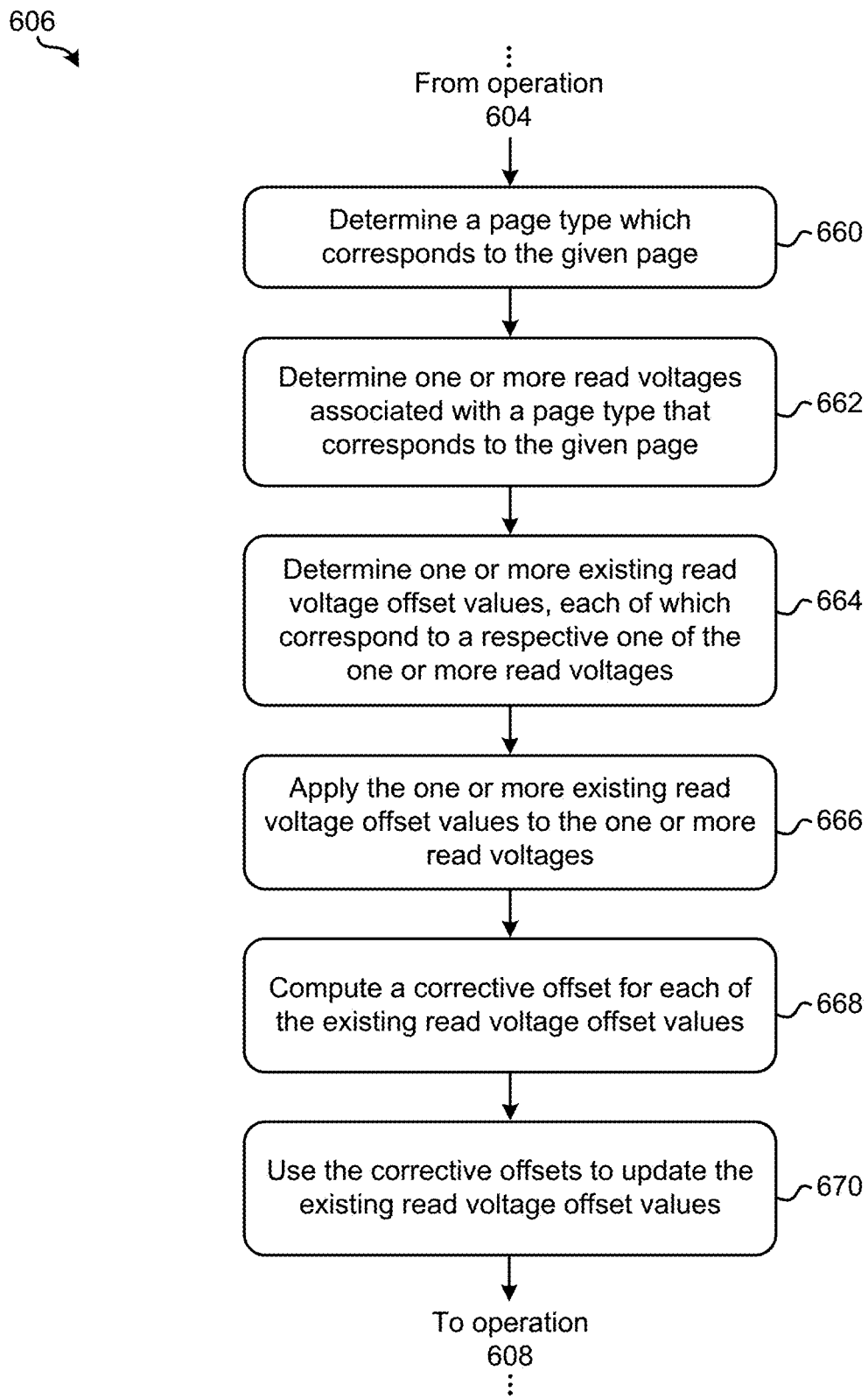
FIG. 6C is a flowchart of sub-processes for one of the operations in the method of FIG. 6A, in accordance with one approach.

Referring now to FIG. 6C, exemplary sub-processes of using the first calibration scheme to calibrate one or more read voltage offset values for the given page in the block are illustrated in accordance with one approach. Any one or more of the sub-processes included in FIG. 6C may be used to perform operation 606 of FIG. 6A. However, it should be noted that the sub-processes of FIG. 6C are illustrated in accordance with one approach which is in no way intended to limit the invention.

As shown, FIG. 6C includes determining a page type which corresponds to the given page. See sub-operation 660. Again, each page type has a different number of read voltages that are associated therewith, e.g., as would be appreciated by one skilled in the art.

A page type may be determined by actually inspecting the physical address of the given page in some instances, while in other situations the page type may be determined by accessing a lookup table. It follows that the page type may be determined using any processes which would be apparent to one skilled in the art after reading the present description. In response to determining the page type, the flowchart proceeds to operation 662 which includes determining one or more read voltages associated with a page type that corresponds to the given page. As noted above, each page type corresponds to a different subset of the total read voltages, e.g., the 15 read voltages in QLC NAND, and the number of read voltages in each subset may be different for each page type. It follows that the number of read voltages that are determined in sub-operation 662 depends on the given page type. These read voltages are fixed for each page type and may depend on the memory device.

Moreover, sub-operation 664 includes determining one or more existing read voltage offset values, each of which correspond to a respective one of the one or more read voltages. In some approaches, the one or more existing read voltage offset values may be determined using a metadata mapping, but any processes may be used which would be apparent to one skilled in the art after reading the present description.

Sub-operation 666 further includes applying the one or more existing read voltage offset values to the one or more read voltages, while sub-operation 668 includes computing a corrective offset for each of the existing read voltage offset values. In some approaches, computing the corrective offset for each of the existing read voltage offset values includes performing a level-shifting algorithm using the one or more existing read voltage offset values and the one or more read voltages. It follows that the process of computing the corrective offsets for the existing read voltage offset values may include actually applying one or more voltages to the given page and use the results of doing so to calculate a new set of corrective offset values.

Proceeding now to sub-operation 670, the corrective offsets are used to update the existing read voltage offset values. In preferred approaches, the corrective offsets are used to update the existing read voltage offset values based on a first metadata mapping. With respect to the present description, the "first metadata mapping" specifies a first mapped relationship which extends between (e.g., which correlates) the corrective offsets and the existing read voltage offset values. This first mapped relationship also corresponds to the first calibration scheme. In other words, although a corrective offset may be determined for each of the existing read voltage offset values, sub-operation 670 is preferably able to determine a common corrective offset which can be applied to each of the existing read voltage offset values.

It should also be noted that any one or more of the sub-processes described above with respect to FIG. 6C may be implemented in order to use the second calibration scheme to recalibrate one or more read voltage offset values for the given page in the block. However, looking specifically to sub-operation 670, it should be noted that the corrective offsets are preferably used to update the existing read voltage offset values based on a second metadata mapping. As noted above, the corrective offsets are used to update the existing read voltage offset values based on a first metadata mapping which corresponds to the first calibration scheme. Accordingly, approaches which involve performing the second calibration scheme to recalibrate one or more read voltage offset values for the given page in the block may differ in some regards.

For instance, the corrective offsets determined in sub-operation 668 above are preferably used to update the existing read voltage offset values based on a second metadata mapping for approaches which implement the second calibration scheme. The second metadata mapping defines a second mapped relationship which extends between (e.g., which correlates) the corrective offsets and the existing read voltage offset values. The second mapped relationship corresponds to the second calibration scheme.

The mapped relationships which extend between the corrective offsets and existing read voltage offset values vary depending on the particular approach. For instance, the first mapped relationship corresponds to the first calibration scheme, while the second mapped relationship corresponds to the second calibration scheme. Looking to FIGS. 7A-7E, the relationship between the page types, read voltages, read voltage offset values, and corrective offsets are explained in further detail according to some exemplary approaches. As an option, any of FIGS. 7A-7E may be implemented in conjunction with features from any other approaches listed herein, such as those described with reference to the other FIGS., such as FIGS. 6A-6C. However, such FIGS. 7A-7E and others presented herein may be used in various applications and/or in permutations which may or may not be specifically described in the approaches herein.

As mentioned above a different set of read voltages correspond to reading the different page types. According to an example, which is in no way intended to limit the invention, from the 15 read voltages used in QLC NAND, i.e., V1, . . . , V15, read voltages V1, V3, V5, V7, V9, V11, V13, V15 are used for reading the top pages, read voltages V2, V6, V10, V14 are used for reading the extra pages, read voltages V4, V12 are used for reading the upper pages, and read voltage V8 is used for reading the lower pages.

Figure 7A:
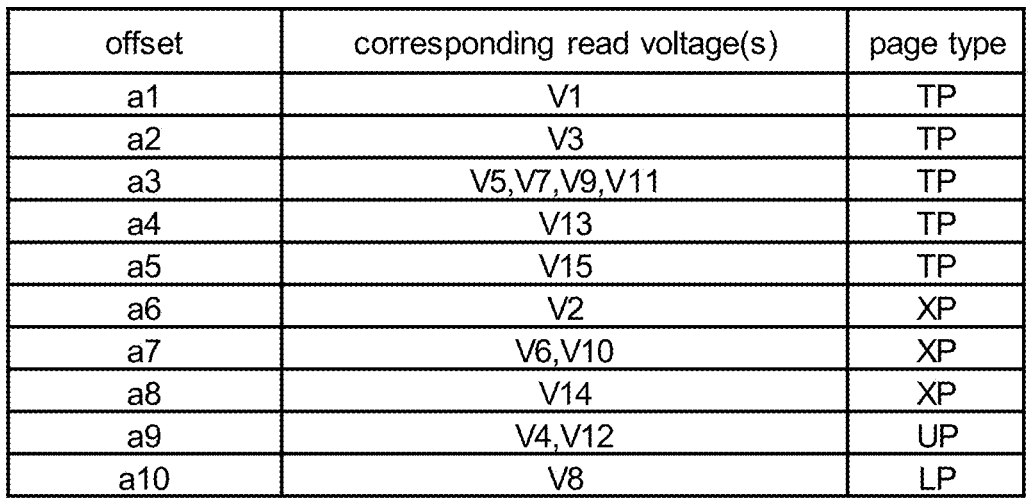
FIG. 7A is a table which illustrates different page types and their corresponding read voltage(s), in accordance with one approach.

Table 710 of FIG. 7A correlates each of the page types with the corresponding read voltage(s) according to one approach. It follows that table 710 depicts a mapped relationship which extends between (e.g., which correlates) the corrective offsets and the existing read voltages for each of the page types. This mapped relationship may also correspond to the second calibration scheme in some situations. According to the mapped relationship of table 710, which again is in no way intended to limit the invention, a total of 10 corrective offsets are mapped to the 15 read voltages in QLC NAND. A common read voltage offset a3 is defined for the read voltages V5, V7, V9, V11 that correspond to the top pages TP, while a unique corrective offset a1, a2, a4, a5 is defined for the remaining read voltages V1, V3, V13, V15 that correspond to the top pages TP, respectively. Accordingly, a common read voltage offset a7 is defined for the read voltages V6, V10 that correspond to the extra pages XP, while a unique corrective offset a6, a8 is defined for the remaining read voltages V2, V14 that correspond to the extra pages XP, respectively.

Further, a common read voltage offset a9 is defined for the read voltages V4, V12 that correspond to the upper pages UP, and a unique read voltage offset a10 is defined for the read voltage V8 that corresponds to the lower pages LP. It follows that in some approaches the implementation depicted in FIG. 7A corresponds to the second calibration scheme described above with respect to method 600.

Figure 7B:
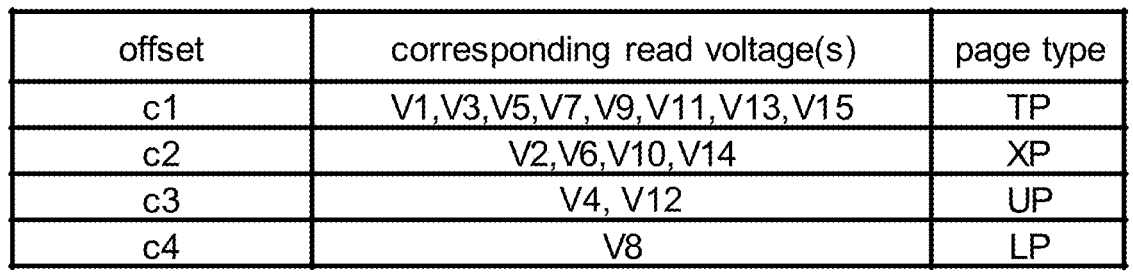
FIG. 7B is a table which illustrates different page types and their corresponding read voltage(s), in accordance with one approach.

Moreover, table 730 of FIG. 7B correlates each of the page types with the corresponding read voltage(s). It follows that table 730 depicts a mapped relationship which extends between (e.g., which correlates) the corrective offsets and the existing read voltages for each of the page types. This mapped relationship may also correspond to the first calibration scheme in some situations. It follows that in some approaches the implementation depicted in FIG. 7B may correspond to the first calibration scheme described above with respect to method 600.

Figure 7C:
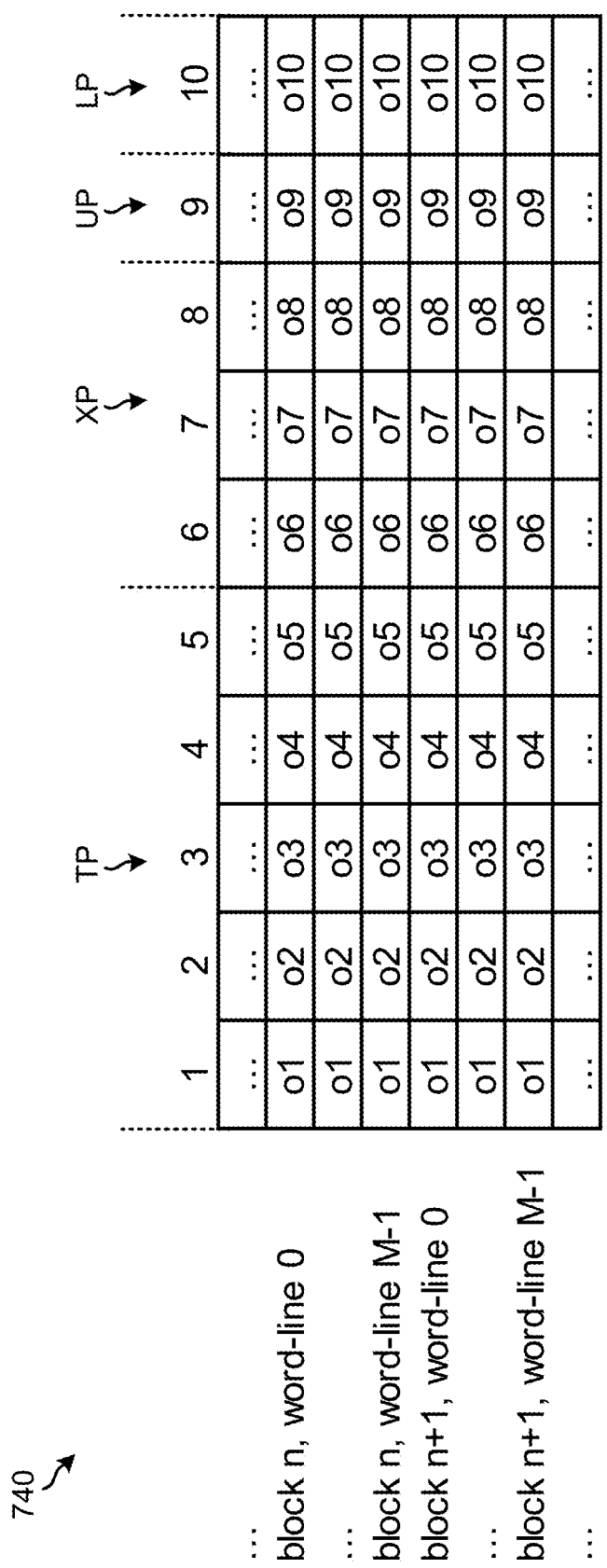
FIG. 7C is a table illustrating the read voltage offset values according to a metadata structure, in accordance with one approach.

The table 740 shown in FIG. 7C illustrates the read voltage offset values according to a metadata structure. As shown, the metadata structure depicted in table 740 supports ten different read voltage offset values (numbered 1-10) for each word-line in a given block. Moreover, each of the read voltage offset values 1-10 correspond to a particular page type TP, XP, UP, LP. Each of the offset values (e.g., o2) may only include one byte of information in some approaches. Accordingly, each row in table 740 represents the metadata that is stored for each word-line in a given block of memory.

It should also be noted that the read voltages and corresponding read voltage offset values determined as a result of implementing the first and/or second calibration schemes may be used to update the values that are stored in table 740. For instance, these values may be used to update the offset values that are applied when attempting to read data from a particular page in a block of a certain word-line. Accordingly, the process of reading a given page may involve accessing table 740, determining the resulting offset value which corresponds to the page, and adjusting the read voltage using the resulting offset value.

Proceeding to table 750 of FIG. 7D and table 760 of FIG. 7E, the metadata which corresponds to a given page in memory may be mapped to a respective corrective offset. However, tables 750 and 760 differ in that table 750 includes a greater amount of corrective offset values, while table 760 relies on a number of common corrective offset values. It follows that table 750 and/or table 760 may be applied to each word-line in a block of memory.

Figure 8A:
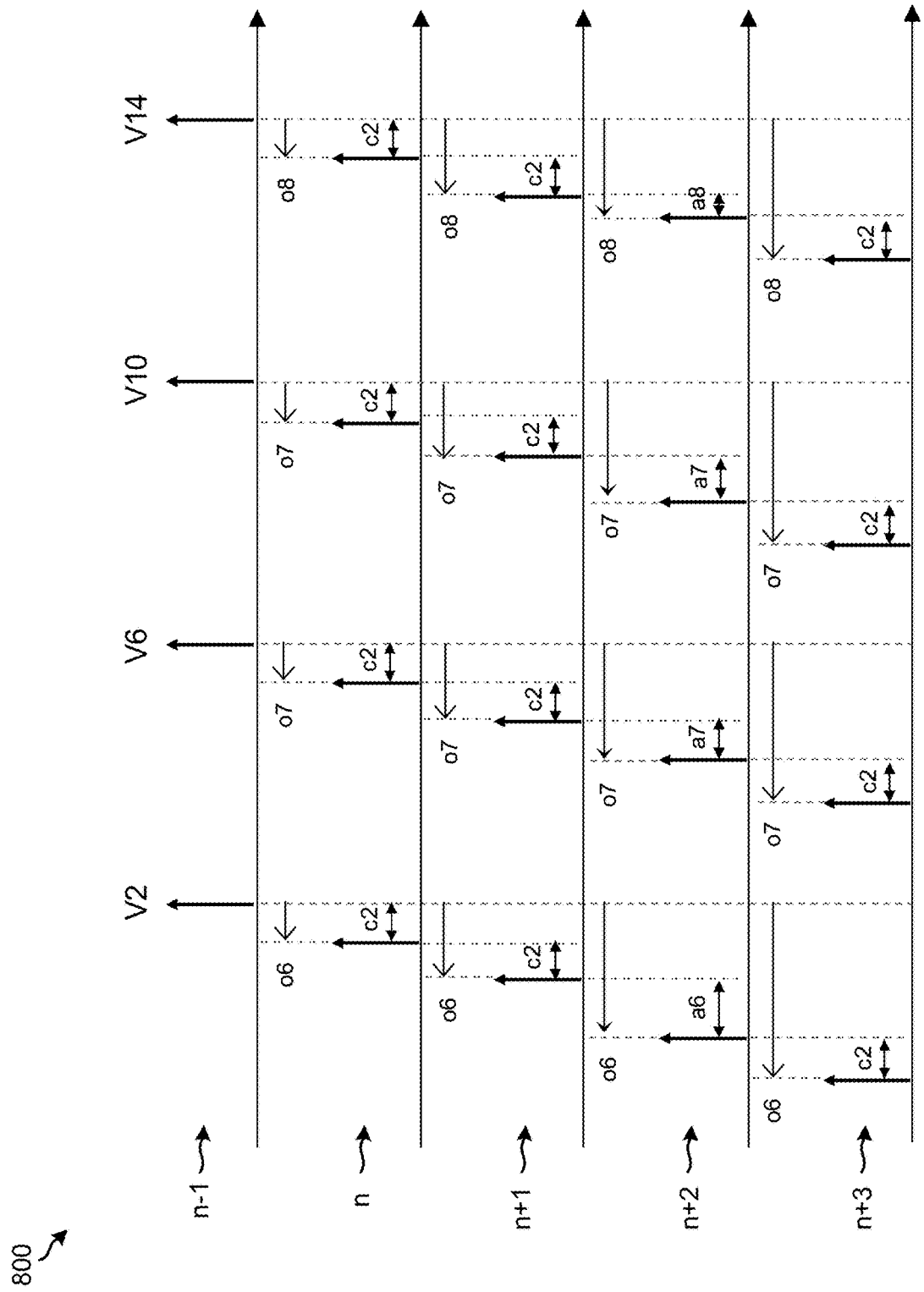
FIG. 8A is a representational view of performing a calibration scheme, in accordance with one approach.

Looking now to FIG. 8A, the process 800 of performing a calibration scheme is illustrated in accordance with an in-use example, which is in no way intended to limit the invention. As shown, in calibration round n−1, an assumption may be made that no read voltage offset values have been determined yet, and therefore that the existing read voltages may be used to read data from each of the pages. However, calibration round n corresponds to the first calibration scheme being applied to an exemplary extra page XP having a read voltage offset value of "c2". This read voltage offset value of c2 is applied to each of the read voltages for the extra page according to the first calibration scheme (e.g., see table 730 above). Similarly, a new read voltage offset value of c2 is applied to each of the already adjusted read voltages in calibration round n+1 according to the first calibration scheme, thereby forming a resulting read voltage offset value of the sum of the corrective offset values of c2 for each of the offsets o6, o7, o8 in the metadata structure (e.g., see table 740 above) as shown.

However, looking to calibration round n+2, the second calibration scheme is implemented and the read voltages are updated using different read voltage offset values. For instance, read voltages V6 and V10 are shifted by a common offset value of a7, while read voltage V2 is shifted by an offset value of a6 and read voltage V14 is shifted by an offset value of a8. Finally, calibration round n+3 reverts back to the first calibration scheme such that a same read voltage offset value of c2 is applied to each of the read voltages as shown.

It should be noted that a controller which may be performing the operations depicted in FIG. 8A may not have access to the actual read voltage values of V2, V6, V10, V14, but may have access to the applied offset values, e.g., namely o6, o7, and o8. As shown, the applied offset o6, o7, o8 for each of the respective voltages may have a same or different value depending on the approach, and the corrective offset values depend on the calibration scheme that is implemented.

As noted above, various ones of the approaches included herein implement different calibration schemes depending on the read performance experienced when attempting to calibrate the given page. Moreover, each of these calibration schemes implement a different number of independent read voltage offset values as well as common read voltage offset values. It follows that the read voltage offset values corresponding to each of the different calibration schemes are preferably interoperable such that they may be used interchangeably depending on the calibration scheme being implemented. This may be achieved in some approaches by utilizing metadata structure and offset update mechanisms which correspond to the memory. This allows for the less computationally intensive first calibration scheme to be implemented during nominal operation, reserving the more computationally intense second calibration scheme for situations in which the added accuracy is desirable.

It follows that the read voltage offset values which correspond to the first and second calibration schemes are preferably stored in memory such that they may be easily converted depending on the calibration scheme that is being implemented. For instance, looking to FIG. 8B, an in-use example of storing read voltage offset values is illustrated. As shown, a background calibration of a given page p in a block b may be initiated at any time. See operation 802. Operation 804 thereby calibrates page p by implementing the first calibration scheme. This process includes loading current read voltage offset values in an expanded format (e.g., a format which corresponds to the second calibration scheme), and using these offset values to perform the calibration of page p. However, the process of using the current read voltage offset values loaded from the metadata structure 801 involves translating the offset values from their expanded format (in which the offset values are stored), to a compact format which corresponds to the first calibration scheme.

According to an example, which is in no way intended to limit the invention, current read voltage offset values are stored in the metadata structure 801 such that ten different read voltage offset values are available, these ten different values including seven independent read voltage offset values and three common read voltage offset values (e.g., as seen in table 710). However, these read voltage offset values are translated such that only four different read voltage offset values are available in order to conduct the first calibration scheme, these four different values including four common read voltage offset values (e.g., as seen in table 730). Translating read voltage offset values may be performed in a number of different ways depending on the given approach. For instance, in some approaches more than one of the independent read voltage offset values may be averaged to produce one common read voltage offset value.

Figure 8B:
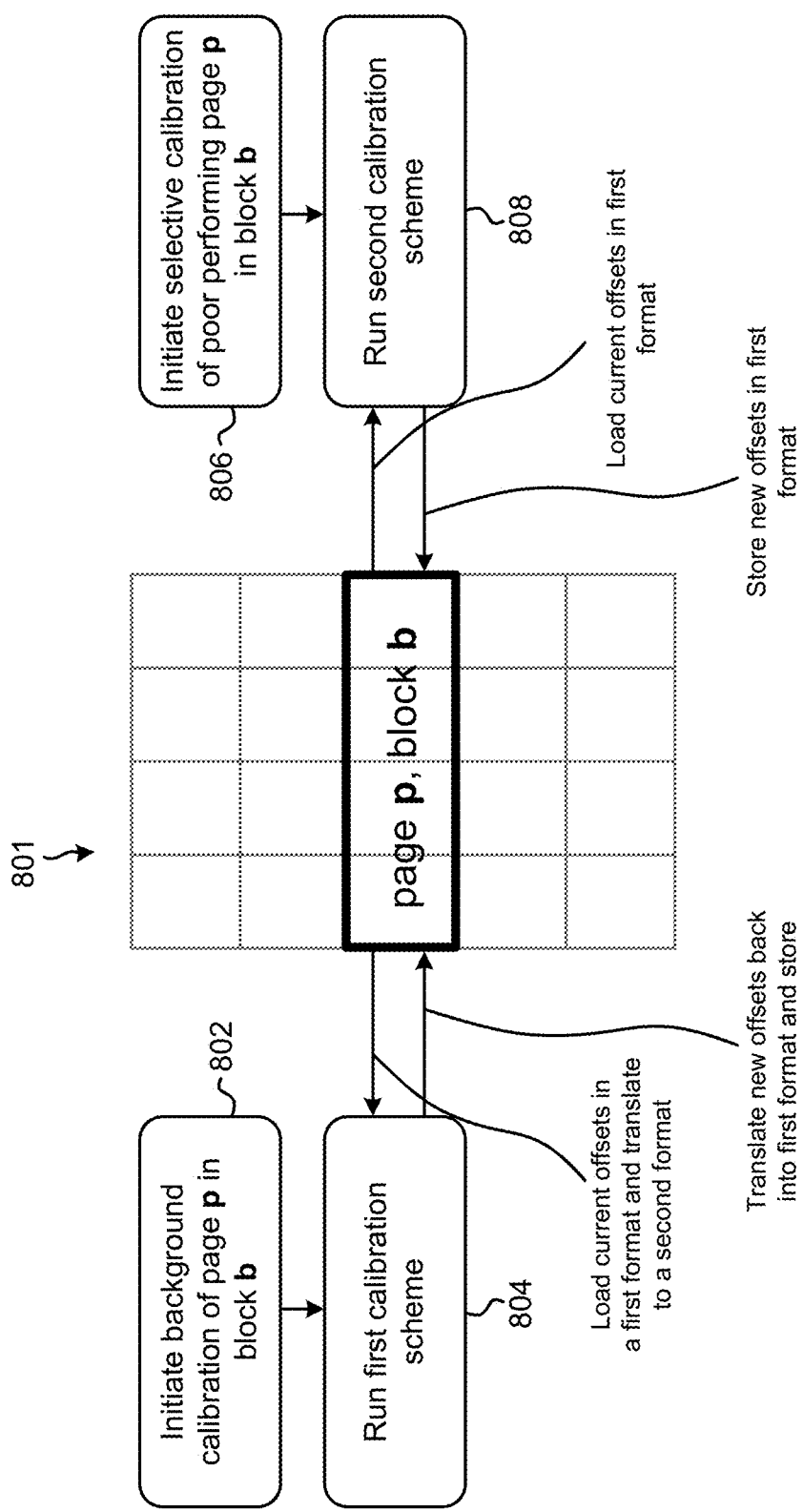
FIG. 8B is a representational view of storing read voltage offset values, in accordance with an in-use example.

With continued reference to FIG. 8B, the results of performing operation 804 are preferably converted back into a format corresponding to the second calibration scheme before being stored in the metadata structure 801. However, in response to page p in block b experiencing an ECC failure a selective calibration. See operation 806. Operation 808 thereby calibrates page p by implementing the second calibration scheme. This process includes loading current read voltage offset values from the metadata structure 801 in an expanded format (e.g., a format which corresponds to the second calibration scheme), and using these offset values to perform the calibration of page p.

Because the current read voltage offset values loaded from the metadata structure 801 are already in a format which corresponds to the second calibration scheme, operation 808 does not involve performing any translations. Similarly, the results of performing operation 808 need not be converted before being stored in the metadata structure 801. Accordingly, in some approaches the metadata structure 801 defines a mapping between the read voltage offset values which correspond to a first calibration scheme in addition to the stored values, and a second mapping between the read voltage offset values which correspond to a second calibration scheme as well as the stored values. This mapping may be based on any desired function that correlates a number of read voltage offset values into a single value. For example, a number of read voltage offset values may be mapped to a single value by calculating an average value, a median value, a weighted average, etc., for the number of read voltage offset values, e.g., as would be appreciated by one skilled in the art after reading the present description. This also desirably avoids performing frequent block relocations in error recovery mode.

It follows that the various ones of the approaches included herein are able to improve operation of memory and/or memory controllers by significantly reducing calibration overhead while also ensuring efficient performance of memory. These improvements may be achieved at least in part as a result of implementing the first calibration scheme during nominal operation, and implementing the second calibration scheme on-demand in error recovery mode situations. As mentioned above, while the second calibration scheme is able to achieve more accurate calibration results compared to the first calibration scheme, the first calibration scheme produces less calibration overhead relative to that experienced as a result of implementing the second calibration scheme. Thus, by selectively implementing the second calibration scheme, performance is improved while also ensuring favorable memory management. Moreover, the manner in which the read voltage offset values are stored in memory is able to further improve accessibility and applicability for the different calibration schemes. This is achieved, at least in part, by storing these offset values in a most complex format, such that the computational complexity of performing any translations are minimized.

It should also be noted that none of the particular configurations included in any of the approaches included herein are intended to be limiting. For instance, the number and/or type of pages included in a given word-line and/or block of memory, the number and/or values of the read voltages, the number and/or values of the threshold voltage levels, the number of common and/or independent read voltage offset values which correspond to each of the calibration schemes, etc., included in any of the approaches herein are in no way intended to be limiting, but rather have been presented by way of example only.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

Figure 9:
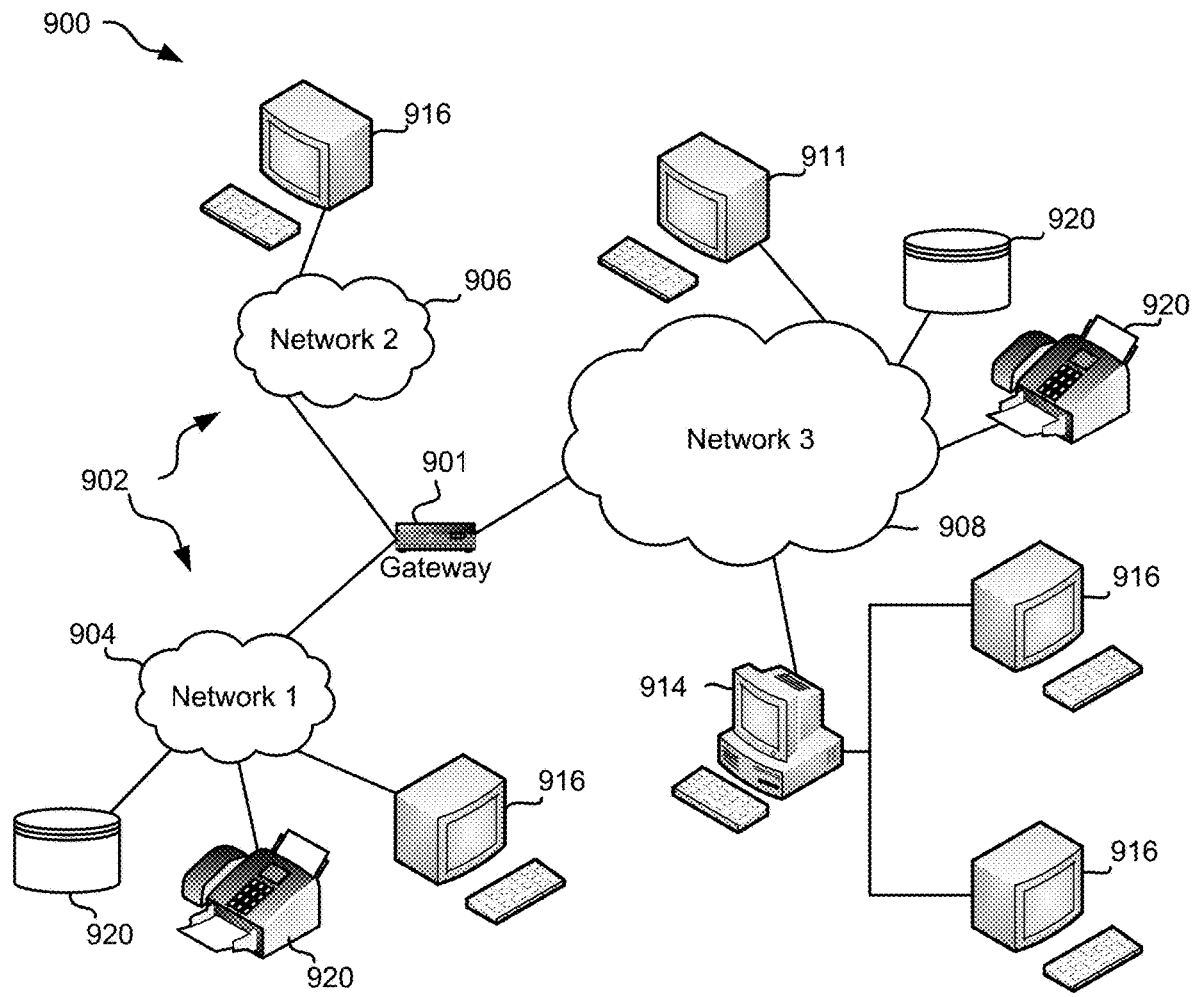
FIG. 9 is a network architecture, in accordance with one approach.

FIG. 9 illustrates a network architecture 900, in accordance with one approach. As shown in FIG. 9, a plurality of remote networks 902 are provided including a first remote network 904 and a second remote network 906. A gateway 901 may be coupled between the remote networks 902 and a proximate network 908. In the context of the present network architecture 900, the networks 904, 906 may each take any form including, but not limited to a LAN, a WAN such as the Internet, public switched telephone network (PSTN), internal telephone network, etc.

In use, the gateway 901 serves as an entrance point from the remote networks 902 to the proximate network 908. As such, the gateway 901 may function as a router, which is capable of directing a given packet of data that arrives at the gateway 901, and a switch, which furnishes the actual path in and out of the gateway 901 for a given packet.

Further included is at least one data server 914 coupled to the proximate network 908, and which is accessible from the remote networks 902 via the gateway 901. It should be noted that the data server(s) 914 may include any type of computing device/groupware. Coupled to each data server 914 is a plurality of user devices 916. Such user devices 916 may include a desktop computer, laptop computer, handheld computer, printer, and/or any other type of logic-containing device. It should be noted that a user device 911 may also be directly coupled to any of the networks, in some approaches.

A peripheral 920 or series of peripherals 920, e.g., facsimile machines, printers, scanners, hard disk drives, networked and/or local data storage units or systems, etc., may be coupled to one or more of the networks 904, 906, 908. It should be noted that databases and/or additional components may be utilized with, or integrated into, any type of network element coupled to the networks 904, 906, 908. In the context of the present description, a network element may refer to any component of a network.

According to some approaches, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some approaches.

In other approaches, one or more networks 904, 906, 908, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 10:
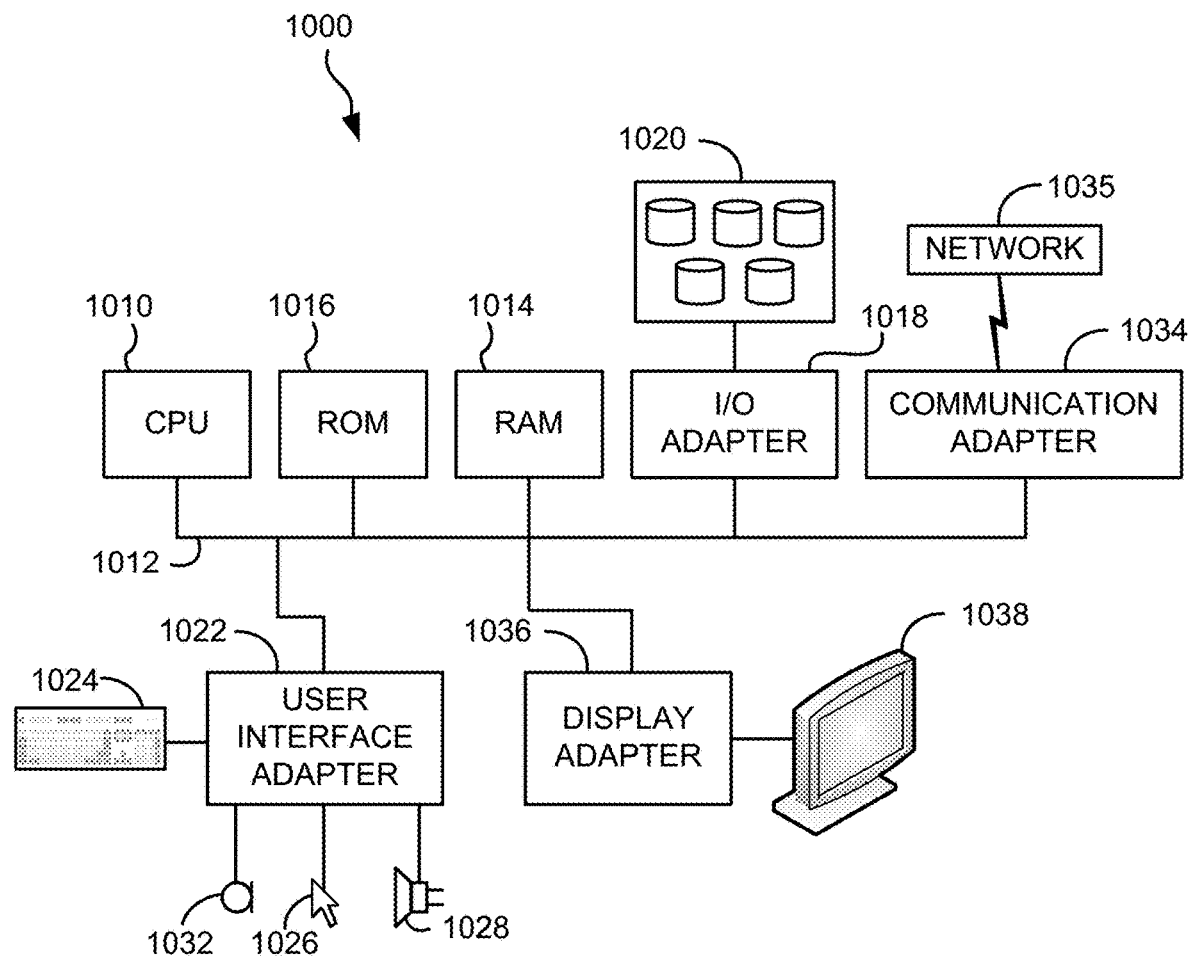
FIG. 10 is a representative hardware environment that may be associated with the servers and/or clients of FIG. 9, in accordance with one approach.

FIG. 10 shows a representative hardware environment associated with a user device 916 and/or server 914 of FIG. 9, in accordance with one approach. FIG. 10 illustrates a typical hardware configuration of a processor system 1000 having a central processing unit 1010, such as a microprocessor, and a number of other units interconnected via a system bus 1012, according to one approach. In some approaches, central processing unit 1010 may include any of the approaches described above with reference to the one or more processors 210 of FIG. 2.

The processor system 1000 shown in FIG. 10 includes a RAM 1014, Read Only Memory (ROM) 1016, and an I/O adapter 1018. According to some approaches, which are in no way intended to limit the invention, I/O adapter 1018 may include any of the approaches described above with reference to I/O adapter 218 of FIG. 2. Referring still to processor system 1000 of FIG. 10, the aforementioned components 1014, 1016, 1018 may be used for connecting peripheral devices such as storage subsystem 1020 to the bus 1012. In some approaches, storage subsystem 1020 may include a similar and/or the same configuration as data storage system 220 of FIG. 2. According to an example, which is in no way intended to limit the invention, storage subsystem 1020 may include non-volatile data storage cards, e.g., having NVRAM memory cards, RAM, ROM, and/or some other known type of non-volatile memory, in addition to RAID controllers as illustrated in FIG. 2.

With continued reference to FIG. 10, a user interface adapter 1022 for connecting a keyboard 1024, a mouse 1026, a speaker 1028, a microphone 1032, and/or other user interface devices such as a touch screen, a digital camera (not shown), etc., to the bus 1012.

Processor system 1000 further includes a communication adapter 1034 which connects the processor system 1000 to a communication network 1035 (e.g., a data processing network) and a display adapter 1036 which connects the bus 1012 to a display device 1038.

The processor system 1000 may have resident thereon an operating system such as the MICROSOFT WINDOWS Operating System (OS), a MAC OS, a UNIX OS, etc. It will be appreciated that a preferred approach may also be implemented on platforms and operating systems other than those mentioned. A preferred approach may be written using JAVA, XML, C, and/or C++ language, or other programming languages, along with an object oriented programming methodology. Object oriented programming (OOP), which has become increasingly used to develop complex applications, may be used.

Figure 11:
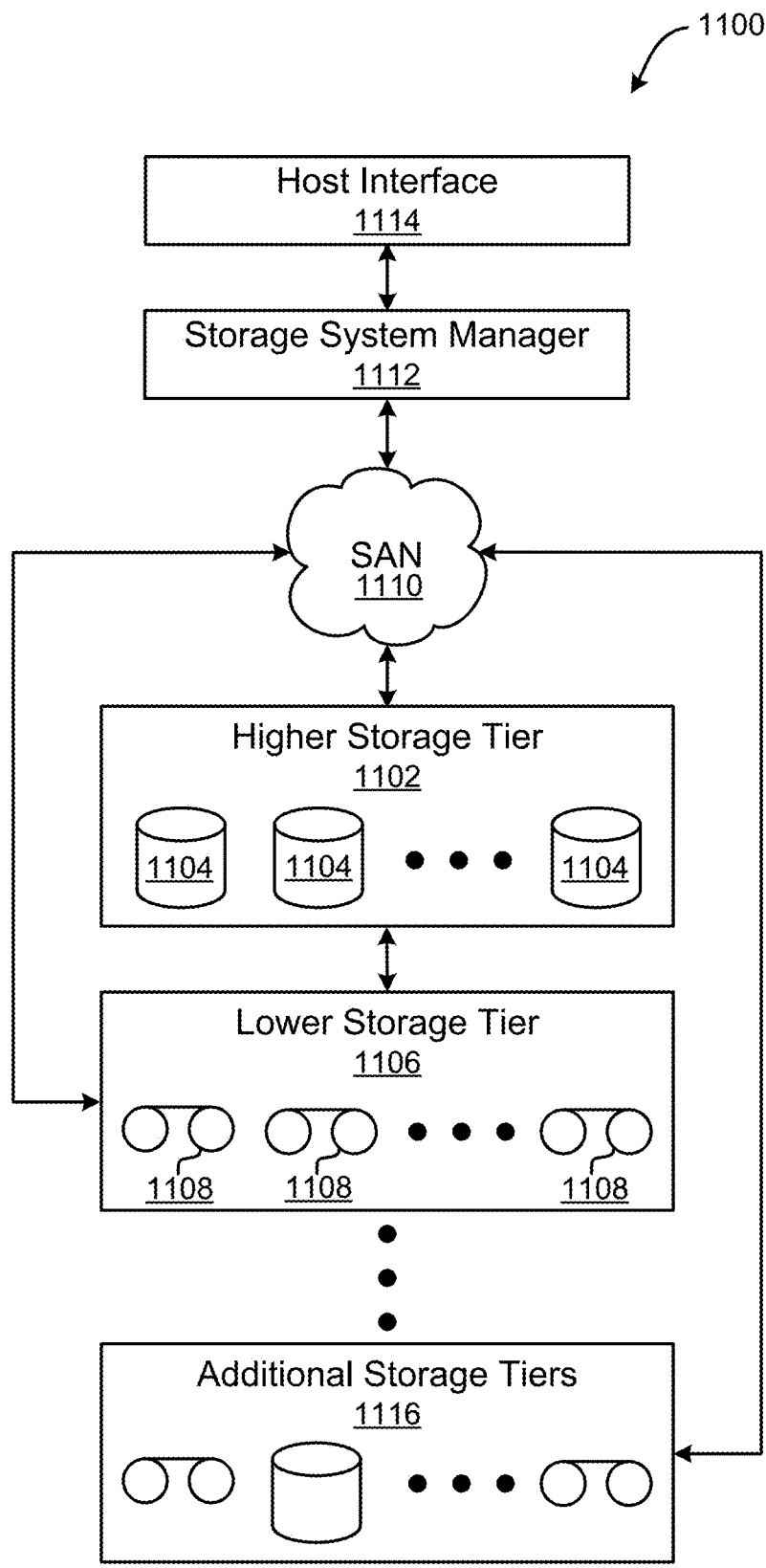
FIG. 11 is a diagram of a tiered data storage system in accordance with one approach.

Moreover, FIG. 11 illustrates a storage system 1100 which implements high level (e.g., SSD) storage tiers in combination with lower level (e.g., magnetic tape) storage tiers, according to one approach. Note that some of the elements shown in FIG. 11 may be implemented as hardware and/or software, according to various approaches. The storage system 1100 may include a storage system manager 1112 for communicating with a plurality of media on at least one higher storage tier 1102 and at least one lower storage tier 1106. However, in other approaches, a storage system manager 1112 may communicate with a plurality of media on at least one higher storage tier 1102, but no lower storage tier. The higher storage tier(s) 1102 preferably may include one or more random access and/or direct access media 1104, such as hard disks, nonvolatile memory (NVM), NVRAM), solid state memory in SSDs, Flash memory, SSD arrays, Flash memory arrays, etc., and/or others noted herein or known in the art. According to illustrative examples, FIGS. 3-4 show exemplary architectures of SSD systems which may be used as a higher storage tier 1102 depending on the desired approach.

Referring still to FIG. 11, the lower storage tier(s) 1106 preferably includes one or more lower performing storage media 1108, including sequential access media such as magnetic tape in tape drives and/or optical media, slower accessing HDDs, slower accessing SSDs, etc., and/or others noted herein or known in the art. One or more additional storage tiers 1116 may include any combination of storage memory media as desired by a designer of the system 1100. Thus, the one or more additional storage tiers 1116 may, in some approaches, include a SSD system architecture similar or the same as those illustrated in FIGS. 1-2. Also, any of the higher storage tiers 1102 and/or the lower storage tiers 1106 may include any combination of storage devices and/or storage media.

The storage system manager 1112 may communicate with the storage media 1104, 1108 on the higher storage tier(s) 1102 and lower storage tier(s) 1106 through a network 1110, such as a storage area network (SAN), as shown in FIG. 11, or some other suitable network type. The storage system manager 1112 may also communicate with one or more host systems (not shown) through a host interface 1114, which may or may not be a part of the storage system manager 1112. The storage system manager 1112 and/or any other component of the storage system 1100 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more approaches, the storage system 1100 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1102, may include a majority of SSD storage media for storing data in a higher performing storage environment, and remaining storage tiers, including lower storage tier 1106 and additional storage tiers 1116 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1102, while data not having one of these attributes may be stored to the additional storage tiers 1116, including lower storage tier 1106. Of course, one of skill in the art, upon reading the present descriptions, may devise many other combinations of storage media types to implement into different storage schemes, according to the approaches presented herein.

According to some approaches, the storage system (such as 1100) may include logic configured to receive a request to open a data set, logic configured to determine if the requested data set is stored to a lower storage tier 1106 of a tiered data storage system 1100 in multiple associated portions, logic configured to move each associated portion of the requested data set to a higher storage tier 1102 of the tiered data storage system 1100, and logic configured to assemble the requested data set on the higher storage tier 1102 of the tiered data storage system 1100 from the associated portions.

Of course, this logic may be implemented as a method on any device and/or system or as a computer program product, according to various embodiments.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising, for pages in a block of memory:
    using a first calibration scheme to calibrate a given page in the block, wherein the first calibration scheme is configured to calculate a first number of independent read voltage offset values and a first number of common read voltage offset values for pages in a block of memory;
    in response to determining that an error correction code failure occurred when attempting to read the calibrated given page, using a second calibration scheme to recalibrate the given page in the block, wherein the second calibration scheme is configured to calculate a second number of independent read voltage offset values and a second number of common read voltage offset values for pages in a block of memory; and
    in response to determining that an error correction code failure occurred when attempting to read the recalibrated given page, sending one or more instructions to relocate data stored in the given page.

2. The computer-implemented method of claim 1, comprising:
    in response to determining that an error correction code failure did not occur when attempting to read the calibrated given page, determining whether an error count corresponding to the given page is in a first predetermined range; and
    in response to determining that the error count corresponding to the given page is in the first predetermined range, using the second calibration scheme to recalibrate the given page in the block.

3. The computer-implemented method of claim 1, comprising:
    in response to determining that an error correction code failure did not occur when attempting to read the recalibrated given page, determining whether an error count corresponding to the given page is in a second predetermined range; and
    in response to determining that the error count corresponding to the given page is in the second predetermined range, sending one or more instructions to relocate data stored in the given page.

4. The computer-implemented method of claim 3, comprising:
    in response to determining that the error count corresponding to the given page is not in the second predetermined range, incrementing an error-recovery counter which corresponds to the given page;
    determining whether the error-recovery counter corresponding to the given page is in a third predetermined range; and
    in response to determining that the error-recovery counter corresponding to the given page is in the third predetermined range, sending one or more instructions to relocate data stored in the given page.

5. The computer-implemented method of claim 1, wherein using the first calibration scheme to calibrate the given page in the block includes:
    determining one or more read voltages associated with a page type that corresponds to the given page;
    determining one or more existing read voltage offset values which correspond to the one or more read voltages;
    computing a corrective offset for each of the existing read voltage offset values; and
    using the corrective offsets to update the existing read voltage offset values.

6. The computer-implemented method of claim 5, wherein the corrective offsets are used to update the existing read voltage offset values based on a first mapped relationship which extends between the corrective offsets and the existing read voltage offset values, wherein the first mapped relationship corresponds to the first calibration scheme.

7. The computer-implemented method of claim 1, wherein using the second calibration scheme to calibrate the given page in the block includes:
    determining one or more read voltages associated with a page type that corresponds to the given page;
    determining one or more existing read voltage offset values which correspond to the one or more read voltages;
    computing a corrective offset for each of the existing read voltage offset values; and
    using the corrective offsets to update the existing read voltage offset values.

8. The computer-implemented method of claim 7, wherein the corrective offsets are used to update the existing read voltage offset values based on a second mapped relationship which extends between the corrective offsets and the existing read voltage offset values, wherein the second mapped relationship corresponds to the second calibration scheme.

9. The computer-implemented method of claim 1, wherein the memory is three-dimensional quad-level-cell NAND Flash, wherein the first number of independent read voltage offset values is less than the second number of independent read voltage offset values.

10. A computer program product comprising a computer readable storage medium having program instructions embodied therewith, the program instructions readable and/or executable by a processor to cause the processor to, for pages in a block of memory:
use, by the processor, a first calibration scheme to calibrate a given page in the block, wherein the first calibration scheme is configured to calibrate a first number of independent read voltage offset values and a first number of common read voltage offset values for pages in a block of memory;
in response to determining that an error correction code failure occurred when attempting to read the calibrated given page, use, by the processor, a second calibration scheme to recalibrate the given page in the block, wherein the second calibration scheme is configured to calibrate a second number of independent read voltage offset values and a second number of common read voltage offset values for pages in a block of memory; and
in response to determining that an error correction code failure occurred when attempting to read the recalibrated given page, send, by the processor, one or more instructions to relocate data stored in the given page.

11. The computer program product of claim 10, wherein the program instructions are readable and/or executable by the processor to cause the processor to:
in response to determining that an error correction code failure did not occur when attempting to read the calibrated given page, determine, by the processor, whether an error count corresponding to the given page is in a first predetermined range; and
in response to determining that the error count corresponding to the given page is in the first predetermined range, use, by the processor, the second calibration scheme to recalibrate the given page in the block.

12. The computer program product of claim 10, wherein the program instructions are readable and/or executable by the processor to cause the processor to:
in response to determining that an error correction code failure did not occur when attempting to read the recalibrated given page, determine, by the processor, whether an error count corresponding to the given page is in a second predetermined range; and
in response to determining that the error count corresponding to the given page is in the second predetermined range, send, by the processor, one or more instructions to relocate data stored in the given page.

13. The computer program product of claim 12, wherein the program instructions are readable and/or executable by the processor to cause the processor to:
in response to determining that the error count corresponding to the given page is not in the second predetermined range, increment, by the processor, an error-recovery counter which corresponds to the given page;
determine, by the processor, whether the error-recovery counter corresponding to the given page is in a third predetermined range; and
in response to determining that the error-recovery counter corresponding to the given page is in the third predetermined range, send, by the processor, one or more instructions to relocate data stored in the given page.

14. The computer program product of claim 10, wherein using the first calibration scheme to calibrate the given page in the block includes:
determining one or more read voltages associated with a page type that corresponds to the given page;
determining one or more existing read voltage offset values which correspond to the one or more read voltages;
computing a corrective offset for each of the existing read voltage offset values; and
using the corrective offsets to update the existing read voltage offset values.

15. The computer program product of claim 14, wherein the corrective offsets are used to update the existing read voltage offset values based on a first mapped relationship which extends between the corrective offsets and the existing read voltage offset values, wherein the first mapped relationship corresponds to the first calibration scheme.

16. The computer program product of claim 10, wherein using the second calibration scheme to calibrate the given page in the block includes:
determining one or more read voltages associated with a page type that corresponds to the given page;
determining one or more existing read voltage offset values which correspond to the one or more read voltages;
computing a corrective offset for each of the existing read voltage offset values; and
using the corrective offsets to update the existing read voltage offset values.

17. The computer program product of claim 16, wherein the corrective offsets are used to update the existing read voltage offset values based on a second mapped relationship which extends between the corrective offsets and the existing read voltage offset values, wherein the second mapped relationship corresponds to the second calibration scheme.

18. The computer program product of claim 10, wherein the memory is three-dimensional quad-level-cell NAND Flash, wherein the first number of independent read voltage offset values is less than the second number of independent read voltage offset values.

19. A system, comprising:
a plurality of non-volatile random access memory (NVRAM) blocks configured to store data;
a processor; and
logic integrated with and/or executable by the processor, the logic being configured to, for pages in one of the blocks:
use, by the processor, a first calibration scheme to calibrate a given page in the block, wherein the first calibration scheme is configured to calibrate a first number of independent read voltage offset values and a first number of common read voltages for pages in a block of memory;
in response to determining that an error correction code failure occurred when attempting to read the calibrated given page, use, by the processor, a second calibration scheme to recalibrate the given page in the block, wherein the second calibration scheme is configured to calibrate a second number of independent read voltage offset values and a second number of common read voltages for pages in a block of memory; and in response to determining that an error correction code failure occurred when attempting to read the recalibrated given page, send, by the processor, one or more instructions to relocate data stored in the given page.

20. The system of claim 19, the logic being configured to:
in response to determining that an error correction code failure did not occur when attempting to read the calibrated given page, determine, by the processor, whether an error count corresponding to the given page is in a first predetermined range; and
in response to determining that the error count corresponding to the given page is in the first predetermined range, use, by the processor, the second calibration scheme to recalibrate the given page in the block.

21. The system of claim 19, the logic being configured to:
in response to determining that an error correction code failure did not occur when attempting to read the recalibrated given page, determine, by the processor, whether an error count corresponding to the given page is in a second predetermined range; and
in response to determining that the error count corresponding to the given page is in the second predetermined range, send, by the processor, one or more instructions to relocate data stored in the given page.

22. The system of claim 21, the logic being configured to:
in response to determining that the error count corresponding to the given page is not in the second predetermined range, increment, by the processor, an error-recovery counter which corresponds to the given page;
determine, by the processor, whether the error-recovery counter corresponding to the given page is in a third predetermined range; and
in response to determining that the error-recovery counter corresponding to the given page is in the third predetermined range, send, by the processor, one or more instructions to relocate data stored in the given page.

23. The system of claim 19, wherein the memory is three-dimensional quad-level-cell NAND Flash, wherein the first number of independent read voltage offset values is less than the second number of independent read voltage offset values.

24. The system of claim 19, wherein using the first calibration scheme to calibrate the given page in the block includes:
determining one or more read voltages associated with a page type that corresponds to the given page;
determining one or more existing read voltage offset values which correspond to the one or more read voltages;
computing a corrective offset for each of the existing read voltage offset values; and
using the corrective offsets to update the existing read voltage offset values.

25. The system of claim 24, wherein the corrective offsets are used to update the existing read voltage offset values based on a first mapped relationship which extends between the corrective offsets and the existing read voltage offset values, wherein the first mapped relationship corresponds to the first calibration scheme.

* * * * *